(12) United States Patent
Ma et al.

(10) Patent No.: US 9,899,556 B2
(45) Date of Patent: Feb. 20, 2018

(54) HYBRID TANDEM SOLAR CELLS WITH IMPROVED TUNNEL JUNCTION STRUCTURES

(71) Applicant: Wisconsin Alumni Research Foundation, Madison, WI (US)

(72) Inventors: Zhenqiang Ma, Middleton, WI (US); Kanglin Xiong, Madison, WI (US); Hongyi Mi, Madison, WI (US); Tzu-Hsuan Chang, Madison, WI (US); Shaoqin Gong, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/853,184

(22) Filed: Sep. 14, 2015

(65) Prior Publication Data

US 2017/0077339 A1 Mar. 16, 2017

(51) Int. Cl.
*H01L 31/0693* (2012.01)

(52) U.S. Cl.
CPC ........ *H01L 31/0693* (2013.01); *Y02E 10/544* (2013.01)

(58) Field of Classification Search
CPC ............... H01L 31/0687; H01L 31/074; H01L 31/0304; H01L 31/0443; H01L 31/028
See application file for complete search history.

(56) References Cited

U.S. PATENT DOCUMENTS

| | | | |
|---|---|---|---|
| 6,881,988 B2 | 4/2005 | Niwa et al. |
| 7,030,428 B2 | 4/2006 | Saxler |
| 7,354,809 B2 | 4/2008 | Yuan et al. |
| 7,777,290 B2 | 8/2010 | Lagally et al. |
| 7,932,123 B2 | 4/2011 | Rogers |
| 7,972,875 B2 | 7/2011 | Rogers |
| 8,163,581 B1 | 4/2012 | Or-Bach |
| 8,217,410 B2 | 7/2012 | Ma et al. |
| 8,227,789 B2 | 7/2012 | Hirayama et al. |
| 8,232,617 B2 | 7/2012 | Ma et al. |
| 8,679,888 B2 | 3/2014 | Rogers |
| 8,722,458 B2 | 5/2014 | Rogers |
| 8,865,489 B2 | 10/2014 | Rogers et al. |

(Continued)

FOREIGN PATENT DOCUMENTS

| | | |
|---|---|---|
| GB | 2453464 | 4/2009 |
| JP | 2005-512327 | 4/2005 |

(Continued)

OTHER PUBLICATIONS

Program Listing for the 42nd IEEE PVSC Conference, New Orleans, LA, Jun. 14-19, 2015, pp. 1-10.

(Continued)

*Primary Examiner* — Bethany L Martin
(74) *Attorney, Agent, or Firm* — Bell & Manning, LLC

(57) ABSTRACT

Tandem solar cells comprising two or more solar cells connected in a solar cell stack via pn diode tunnel junctions and methods for fabricating the tandem solar cells using epitaxial lift off and transfer printing are provided. The tandem solar cells have improved tunnel junction structures comprising a current tunneling layer integrated between the p and n layers of the pn diode tunnel junction that connects the solar cells.

16 Claims, 25 Drawing Sheets

(56) References Cited

U.S. PATENT DOCUMENTS

| | | | |
|---|---|---|---|
| 8,866,154 | B2 | 10/2014 | Ma |
| 8,895,406 | B2 | 11/2014 | Rogers |
| 2002/0144725 | A1* | 10/2002 | Jordan .............. H01L 31/02167 136/247 |
| 2003/0032253 | A1 | 2/2003 | Nguyen et al. |
| 2004/0079408 | A1* | 4/2004 | Fetzer ................... H01L 31/184 136/262 |
| 2004/0164319 | A1 | 8/2004 | Zampardi et al. |
| 2005/0218428 | A1 | 10/2005 | Bahl et al. |
| 2006/0086932 | A1 | 4/2006 | Kim et al. |
| 2006/0121682 | A1 | 6/2006 | Saxler |
| 2006/0180830 | A1 | 8/2006 | Alavi et al. |
| 2007/0194300 | A1* | 8/2007 | Ibbetson ................ H01L 29/88 257/30 |
| 2007/0227588 | A1* | 10/2007 | Gossard .............. H01L 31/0352 136/255 |
| 2011/0174377 | A1 | 7/2011 | Lee |
| 2011/0272012 | A1* | 11/2011 | Heng .................. H01L 31/0745 136/255 |
| 2013/0192656 | A1* | 8/2013 | Hardin .................. H01L 31/078 136/244 |
| 2013/0277642 | A1 | 10/2013 | Kneissl et al. |
| 2014/0264375 | A1 | 9/2014 | Ma et al. |
| 2014/0315723 | A1* | 10/2014 | Moyerman ......... H01L 39/2493 505/160 |
| 2015/0059837 | A1* | 3/2015 | Cornfeld ............ H01L 31/1844 136/255 |
| 2015/0207012 | A1 | 7/2015 | Rogers |
| 2016/0204306 | A1 | 7/2016 | Ma et al. |

FOREIGN PATENT DOCUMENTS

| | | |
|---|---|---|
| JP | 2007-103689 | 4/2007 |
| JP | 4959693 | 6/2012 |
| KR | 10-2003-0063075 | 7/2003 |
| KR | 10-2005-0081207 | 8/2005 |
| KR | 10-2006-0036713 | 5/2006 |
| KR | 10-2007-0063912 | 6/2007 |
| WO | WO 2015/061770 | 4/2015 |

OTHER PUBLICATIONS

Kanglin Xiong et al., AlGaAs/Si dual-junction tandem solar cells fabricated by epitaxial lift-off and print transfer assisted bonding, Conference Abstract for 42nd IEEE PVSC Conference, New Orleans, LA, Jun. 14-19, 2015, p. 1.

Jongseung Yoon et al., GaAs photovoltaics and optoelectronics using releasable multilayer epitaxial assemblies (and Supplemental Information), Nature, vol. 465, May 20, 2010, p. 329.

Scott Burroughs et al., A New Approach for a Low Cost CPV Module Design Utilizing Micro-Transfer Printing Technology, CP1277, 6th International Conference on Concentrating Photovoltaic Systems—(CPV-6), American Institute of Physics, 2010, pp. 163-166.

Xing Sheng et al., Printing-based assembly of quadruple-junction four-terminal microscale solar cells and their use in high-efficiency modules, Nature Materials, vol. 13, Apr. 28, 2014, pp. 593-598.

Katsuaki Tanabe et al., III-V/Si hybrid photonic devices by direct fusion bonding, Scientific Reports, 2:349, Apr. 2, 2012, pp. 1-6.

Lumb, M.P., Development of InGaAs solar cells for >44% efficient transfer-printed multi-junctions, Conference Abstract for Photovoltaic Specialist Conference (PVSC), 2014 IEEE 40th, Jun. 8-13, 2014, pp. 1-2.

Gui et al., The effect of surface roughness on direct wafer bonding, Journal of Applied Physics, vol. 85, No. 10, May 15, 1999, pp. 7448-7454.

Chen et al., Epitaxially oriented growth of diamond on silicon by hot filament chemical vapor deposition, Appl. Phys. Lett., vol. 68, No. 2, Jan. 8, 1996, pp. 176-178.

Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.

International Search Report and Written Opinion issued in PCT/US2014/011569, dated May 20, 2014.

Intl. Search Report & Written Opinion for Intl. Patent Appl. No. PCT/US2015/054018, dated Feb. 11, 2016, 11 pages.

* cited by examiner

AlGaAs Solar Cell Structures

| GaAs | N++ | Si=5e18 | 300nm |
|---|---|---|---|
| Al$_{0.5}$Ga$_{0.5}$As | N++ | Si=5e18 | 20nm |
| Al$_{0.3}$Ga$_{0.7}$As | N+ | Si=5e18 | 150nm |
| Al$_{0.3}$Ga$_{0.7}$As | P- | Be=1e17 | 1300nm |
| Al$_{0.5}$Ga$_{0.5}$As | P+ | Be=8e18 | 30nm |
| GaAs | P++ | Be=5e19 | 25nm |

FIG. 8A

Si Solar Cell Structures

| Si | N++ | P>1e21 | 100nm |
|---|---|---|---|
| Si | p- | P~1e17 | 300μm |
| Si | P++ | B<1e21 | 100nm |

FIG. 8B

HYBRID TANDEM SOLAR CELLS WITH IMPROVED TUNNEL JUNCTION STRUCTURES

REFERENCE TO GOVERNMENT RIGHTS

This invention was made with government support under FA9550-09-1-0482 awarded by the USAF/AFOSR and N00014-13-1-0226 awarded by the US NAVY/ONR. The government has certain rights in the invention.

BACKGROUND

Due to the superior optical and electrical properties of Group III-V materials, homogeneous epitaxial III-V solar cells are incomparable when considering energy conversion efficiency. (See, M. A. Green, K. Emery, Y. Hishikawa, W. Warta, E. D. Dunlop, *Prog. Photovolt. Res. Appl.* 2015, 23, 1.) However, they generally are too expensive for many terrestrial and non-concentration applications. Meanwhile, single crystal Si solar cells have been widely adopted by households and solar plants due to their affordable price. Although, their efficiency is limited by thermal relaxation of hot carriers. In order to take advantage of the benefits of both types of solar cells, numerous attempts have been made to fabricate high quality hybrid Group III-V/Si tandem solar cells using various techniques.

Direct growth is a process that can simplify the device processing flow for tandem solar cells. However, the challenge of epitaxial growth of high quality III-V materials directly on Si substrates, while long identified, remains partially unsolved. The main problem arises from the large lattice mismatch between GaAs and Si, and disparities in thermal expansion coefficients between III-V semiconductor materials and Si. In addition, the transition from non-polar Si to polar III-V materials could introduce an anti-phase domain. AlGaAs/Si tandem solar cells and GaInP/GaAs tandem solar cells on non-active Si carrier substrates have been demonstrated. (See, T. Soga, T. Kato, M. Yang, M. Umeno, T. Jimbo, *J. Appl. Phys.* 1995, 78, 4196 and F. Dimroth, T. Roesener, S. Essig, C. Weuffen, A. Wekkeli, E. Oliva, G. Siefer, K. Volz, T. Hannappel, D. Haussler, W. Jager, A. W. Bett, *IEEE J. Photovolt.* 2014, 4, 620.) However, their performance is limited by short minority diffusion lengths resulting from high dislocation densities of over $10^7/cm^2$, despite the thick buffer layers used. To circumvent the problem with heterogeneous growth of III-V on Si, a thin single crystal nucleation layer, such as an InP and GaAs layer, has been transferred onto Si solar cells by wafer bonding and lift-off. Subsequently, III-V solar cells were grown on the InP/Si or GaAs/Si solar cells. (See, J. Schone, F. Dimroth, A. W. Bett, A. Tauzin, C. Jaussaud, J. C. Roussin, in *Conf Rec. 2006 IEEE 4th World Conf. Photovolt. Energy Conyers.*, 2006, pp. 776-779 and M. J. Archer, D. C. Law, S. Mesropian, M. Haddad, C. M. Fetzer, A. C. Ackerman, C. Ladous, R. R. King, H. A. Atwater, *Appl. Phys. Lett.* 2008, 92, 103503.) However, these processes not only complicate fabrication, but also suffer from the formation of cracks in the III-V thin film during growth, due to thermal strain.

As an alternative to direct growth, wafer bonding allows the homogeneous epitaxial growth of different high performance solar cells on different substrate wafers. Once the wafers are bonded, one wafer can be lifted off by wet chemicals. The direct bonding of GaInP/GaAs on GaAs and GaInAsP/GaInAs on InP has yielded four junction solar cells with world record efficiency for concentration applications. (See, F. Dimroth, M. Grave, P. Beutel, U. Fiedeler, C. Karcher, T. N. D. Tibbits, E. Oliva, G. Siefer, M. Schachtner, A. Wekkeli, A. W. Bett, R. Krause, M. Piccin, N. Blanc, C. Drazek, E. Guiot, B. Ghyselen, T. Salvetat, A. Tauzin, T. Signamarcheix, A. Dobrich, T. Hannappel, K. Schwarzburg, *Prog. Photovolt. Res. Appl.* 2014, 22, 277.) There is also ongoing research on the bonding of III-V semiconductors to Si for solar cells, which mainly focuses on low temperature, interface optical transparency, and thermal and electrical conductivity. (See, J. Liang, S. Nishida, M. Morimoto, N. Shigekawa, *Electron. Lett.* 2013, 49, 830; J. Liang, T. Miyazaki, M. Morimoto, S. Nishida, N. Watanabe, N. Shigekawa, *Appl. Phys. Express* 2013, 6, 021801 and S. Essig, O. Moutanabbir, A. Wekkeli, H. Nahme, E. Oliva, A. W. Bett, F. Dimroth, *J. Appl. Phys.* 2013, 113, 203512.) Surface-activated direct bonding at room temperature avoids high temperature annealing, and a GaInP/GaAs/Si triple junction solar cell has been demonstrated. (See, K. Derendorf, S. Essig, E. Oliva, V. Klinger, T. Roesener, S. P. Philipps, J. Benick, M. Hermle, M. Schachtner, G. Siefer, W. Jager, F. Dimroth, *IEEE J. Photovolt.* 2013, 3, 1423.) Direct fusion bonding under a low post-bonding temperature of 500° C. or less has also been investigated and a dual-junction AlGaAs/Si has been fabricated. (See, K. Tanabe, K. Watanabe, Y. Arakawa, *Sci. Rep.* 2012, 2, DOI 10.1038/srep00349.) Non-direct bonding, which uses agents, such as metal or carbon nanotubes, would sacrifice the interface properties and is thus not optimal for photovoltaic applications. (See, C.-T. Lin, W. E. McMahon, J. S. Ward, J. F. Geisz, M. W. Wanlass, J. J. Carapella, W. Olavarria, E. E. Perl, M. Young, M. A. Steiner, R. M. France, A. E. Kibbler, A. Duda, T. E. Moriarty, D. J. Friedman, J. E. Bowers, *Prog. Photovolt. Res. Appl.* 2014, n/a and A. Boca, J. C. Boisvert, D. C. Law, S. Mesropian, N. H. Karam, W. D. Hong, R. L. Woo, D. M. Bhusari, E. Turevskaya, P. Mack, P. Glatkowski, in 2010 *35th IEEE Photovolt. Spec. Conf. PVSC,* 2010, pp. 003310-003315.) In all of the above-mentioned wafer bonding processing techniques, the bonded III-V wafers are usually removed by chemical etching after the bonding, in order to expose the top solar cell layer. This is not only a waste of expensive materials, but also results in high production costs.

Recently, with $As_2Se_3$ as the bonding agent, triple junction InGaP/GaAs/InGaAsNSb epitaxially-grown solar cells have been bonded onto Ge solar cells after being released from the GaAs wafer. (See, X. Sheng, C. A. Bower, S. Bonafede, J. W. Wilson, B. Fisher, M. Meitl, H. Yuen, S. Wang, L. Shen, A. R. Banks, C. J. Corcoran, R. G. Nuzzo, S. Burroughs, J. A. Rogers, *Nat. Mater.* 2014, 13, 593.)

SUMMARY

Tandem solar cells comprising two or more solar cells electrically and optically connected in a solar cell stack via pn diode tunnel junctions are provided. Also provided are methods for fabricating the tandem solar cells using epitaxial lift off and transfer printing techniques.

One embodiment of a tandem solar cell comprises: (a) a first solar cell comprising: a back surface field comprising a p- or n-type doped semiconductor; a base comprising a p- or n-type doped semiconductor; and an emitter comprising an n- or p-type doped semiconductor, wherein the dopant type of the back surface field and the base is the opposite of the dopant type of the emitter; (b) a second solar cell stacked atop the first solar cell, wherein the second solar cell absorbs a different range of wavelengths than the first solar cell, the second solar cell comprising: a back surface field comprising an p- or n-type doped semiconductor; a base comprising a p- or n-type doped semiconductor; and an emitter comprising an n- or p-type doped semiconductor, wherein the dopant type of the back surface field and the base is the opposite of the dopant type of the emitter; and (c) a pn diode tunnel junction connecting the first solar cell to the second solar cell, the pn diode tunnel junction comprising: a first tunnel junction layer comprising an n- or p-type doped semiconductor on the upper surface of the first solar cell; a second tunnel junction layer comprising a p- or n-type doped semiconductor on the lower surface of the second solar cell; and a current tunneling layer disposed between and in contact with the first and second tunnel junction layers. The current tunneling layer comprises an inorganic material having a bandgap that is wider than the bandgaps of the semiconductors of the first and second tunnel junction layers.

One embodiment of a method for making a tandem solar cell comprises the steps of: (a) growing a pn junction solar cell comprised of Group III-V semiconductor materials on a sacrificial substrate; (b) releasing the pn junction solar cell comprised of Group III-V semiconductor materials from the sacrificial substrate; and (c) transferring the released pn junction solar cell comprised of Group III-V semiconductor materials onto a pn junction solar cell comprised of Si to form a Group III-V/silicon hybrid tandem solar cell comprising the pn junction solar cell comprised of Group III-V semiconductor materials connected to the pn junction solar cell comprising Si via a pn diode tunnel junction.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 8A. Table of the composition, dopant type and concentration, and thickness of the layers in the AlGaAs-based solar cell of FIG. 7. FIG. 8B. Table of the composition, dopant type and concentration, and thickness of the layers in the Si-based solar cell of FIG. 7.

DETAILED DESCRIPTION

Tandem solar cells comprising two or more solar cells electrically and optically connected in a solar cell stack via pn diode tunnel junctions and methods for fabricating the tandem solar cells using epitaxial lift off and transfer printing are provided.

The tandem solar cells include hybrid tandem solar cells in which a first solar cell is fabricated from Group IV semiconductors, such as silicon, and a second, neighboring solar cell is fabricated from compound semiconductors, such as Group III-V and/or Group II-VI semiconductors. The combination of Group III-V-based solar cells with Si-based solar cells in a tandem solar cell is particularly advantageous because that combination can take advantage of the high conversion efficiencies offered by Group III-V-based solar cells and the relatively low cost and mature processing techniques of silicon solar cells. In addition, the high thermal conductivity and mechanical strength of Si makes it a reliable support for Group III-V-based solar cells.

The tandem solar cells also include those having improved tunnel junction structures comprising a current tunneling layer integrated between the p and n layers of the pn diode tunnel junction that connects the solar cells. The improved tunnel junctions can provide the tandem solar cells with improved adhesion between neighboring solar cells in the solar cell stack, increased conductivity within the tandem solar cell, and improved energy conversion efficiencies.

The tandem solar cells can be fabricated using ELO and transfer printing techniques in which one or more of the solar cells are grown epitaxially on a sacrificial layer over a growth substrate, such as semiconductor wafer. Using ELO, the solar cells are released from the growth substrate and transfer printed onto another solar cell, which then provides the base solar cell of the tandem solar cell. The ELO and transfer printing approach eliminates the need for a lattice match between the materials of the first solar cell and the materials of its neighboring solar cell and also minimizes material waste because it does not require large-scale etching away of the growth substrate. In fact, the present methods allow for the reuse of the growth substrate after the release and transfer of each solar cell. This is particularly advantageous for Group III-V-based solar cells because their active regions can be made quite thin—only a few micrometers—and, therefore, many such solar cells can be fabricated from a single growth substrate.

Figure 2A:
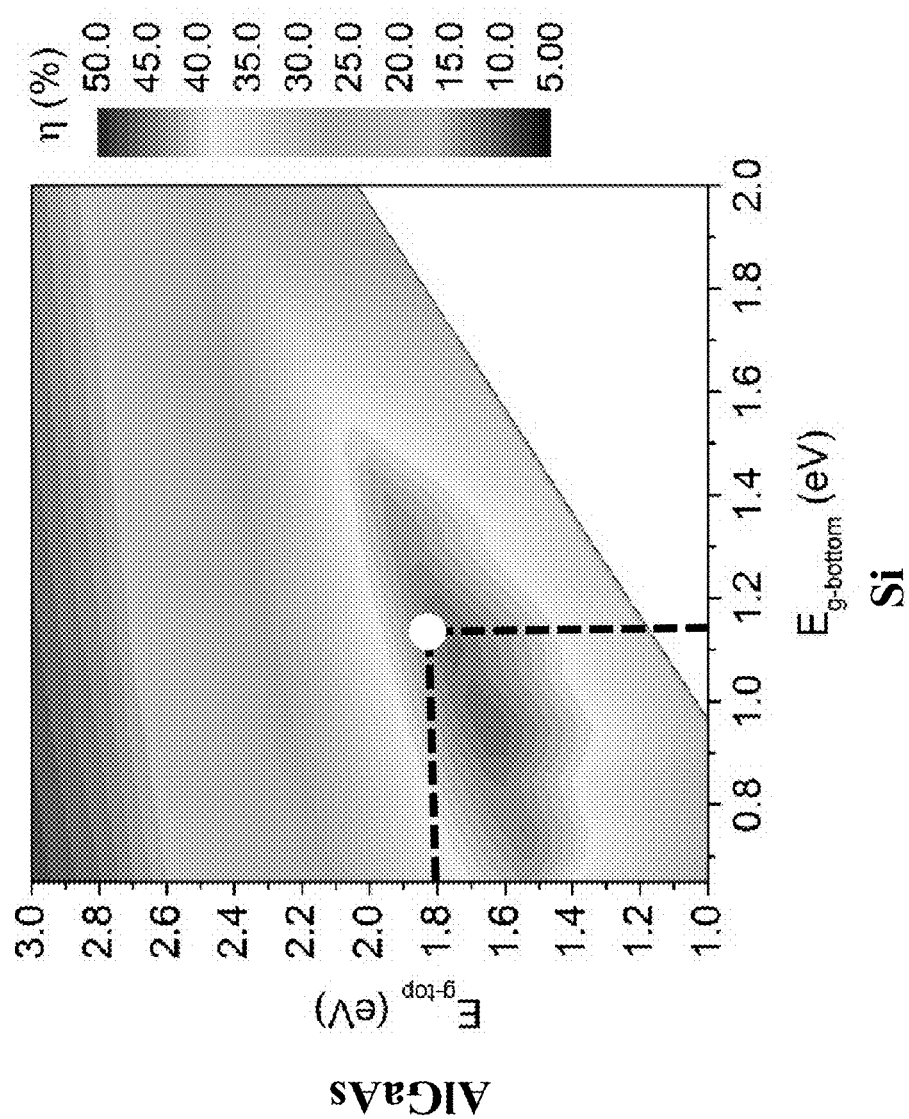
FIG. 2A. The Shockley-Queisser efficiency limit for a two junction tandem AlGaAs/Si solar cell. The optimal efficiency location for $Al_{0.3}Ga_{0.7}As$ ($E_g$=1.8 eV)-Si ($E_g$=1.12 eV) is marked.
Figure 2B:
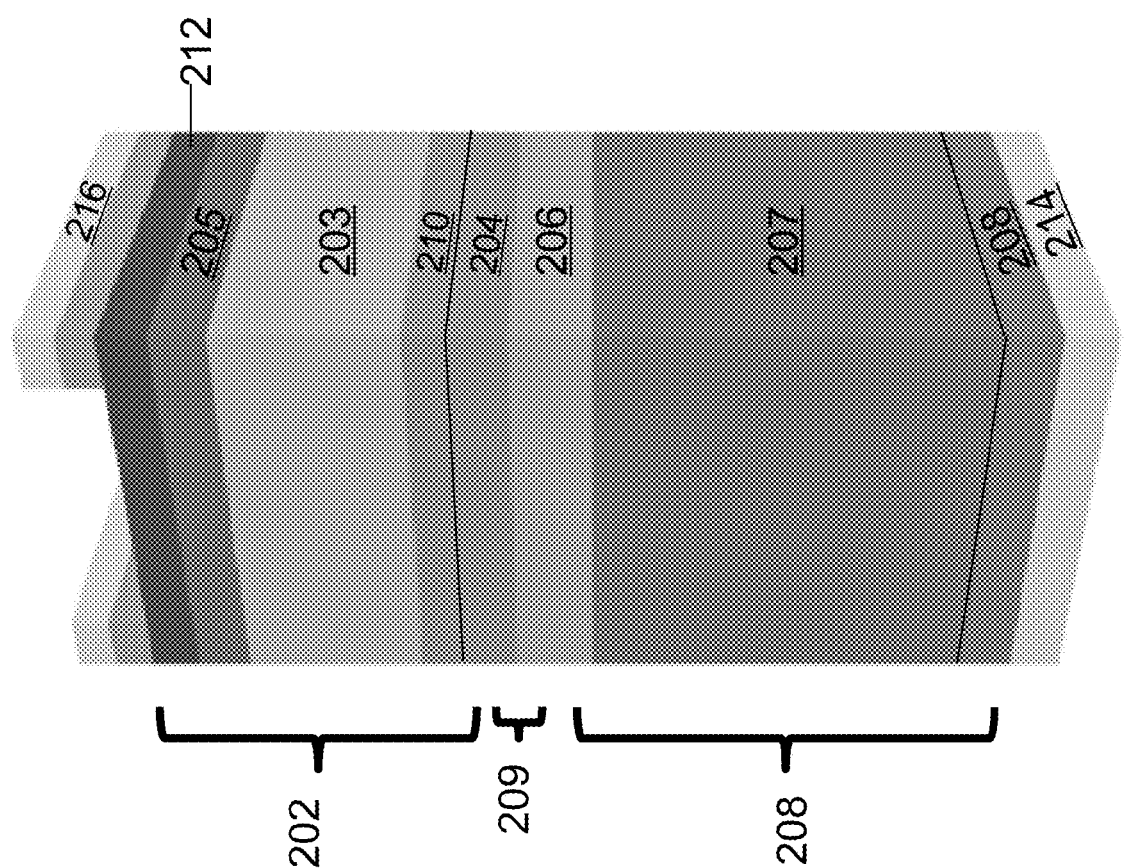
FIG. 2B. The schematic structure of a two junction tandem $Al_{0.3}Ga_{0.7}As$/Si solar cell.

A schematic diagram of one embodiment of a hybrid dual junction tandem solar cell is shown in FIG. 2B. The tandem cell comprises a first (lower) solar cell 208 and a second (upper) solar cell 202 connected by a pn diode tunnel junction 209. The first and second solar cells are designed to absorb and produce electrical current in response to incident radiation comprising different wavelength ranges. The pn diode tunnel junction formed at the interface of the first and second solar cells provides a connection with a low electrical resistance and low optical loss.

First solar cell 208 comprises a base 207 and an emitter 206. Second solar cell 202 also comprises a base 203 and an emitter 205. In each of the solar cells, one of either the base or the emitter is p-type doped and the other n-type doped to provide a light-absorbing pn junction 209. The solar cells may be n-on-p solar cells in which the emitter is n-type doped and the base is p-type doped. Or, they may be p-on-n solar cells in which the emitter is p-type doped and the base is n-type doped. Typically, the solar cells will also include a back surface field (BSF) 208, 210 at their rear surface, below their base. The BSFs have the same dopant type (i.e., either n-type or p-type) as their base, but are typically more heavily doped. Optionally, the solar cells may include a window 212 on the front surface of their emitter. (In the embodiment of FIG. 2B, only the second solar cell includes a window.) The window has the same dopant type as the emitter, but is typically more heavily doped. The window and BSF should be optically transparent to radiation wavelengths to be absorbed by any underlying solar cells in the stack. The lowermost and uppermost solar cells in the stack may additionally comprise one or more electrically conductive contact pads 214, 216 disposed on their outer surfaces.

In addition to the components discussed above, the solar cells may include other layers conventionally found in pn junction solar cells. For examples buffer layers may be included between non-lattice matched materials in a solar cell to allow for epitaxial growth of one material on another and contact layers may be included to enhance the electrical communication with the contact pads.

The various layers making up the active layers in the solar cells typically comprise high-quality, single-crystalline semiconductor materials that are chosen based on their light absorption properties. Because neighboring solar cells in the tandem solar cell stack do not need to be grown epitaxially as a monolithic structure, the materials for each solar cell can be selected independently. Suitable semiconductor materials include Group IV semiconductors, such as Si and Ge; Group III-V semiconductors, such as GaAs-based semiconductors (e.g., AlGaAs) or GaP-based semiconductors (e.g., InGaP); and Group II-VI semiconductors. In some embodiments, the tandem solar cells comprise a combination of one or more solar cells comprising a Group IV semiconductor and one or more solar cells comprising a Group III-V and/or a Group II-VI semiconductor. The Group IV semiconductors include all elemental semiconductors (e.g., Si, Ge and C), as well as alloy and compound semiconductors (e.g., SiGe:C, SiGe, SiGeSn and SiC). The Group III-V and Group II-VI semiconductors include binary, ternary and higher compound semiconductors. Examples of Group III-V semiconductors include GaAs, AlGaAs, InGaAs, AlAs, InAlAs, InP, GaInP, GaP, GaN, InGaN, InAlN and AlGaN. Examples of Group II-VI semiconductors include oxides, such as ZnO.

In the tandem solar cell design shown in FIG. 2B, the pn diode tunnel junction 209 that connects the neighboring solar cells is a two-layer heterostructure comprising a p-type tunnel junction layer and an n-type tunnel junction layer. Together these layers provide a pn diode through which electrons can travel. The two tunnel junction layers are heavily doped and comprise a relatively wide bandgap semiconductor. The tunnel junction layers desirably, but not necessarily, have degenerate doping levels. In some embodiments of the solar cells, the n-type and/or p-type tunnel junction layers are distinct layers in the solar cells. For example, in second solar cell 202 in FIG. 2B, a heavily p-type doped (p++) tunnel junction layer 204 is provided below the BSF. In other embodiments of the solar cells, the surface region of an outermost (e.g., uppermost or lowermost) solar cell component, such as the emitter, window or BSF, can itself provide the n-type or p-type tunnel junction layer of the pn diode tunnel junction. For example, in first solar cell 208 in FIG. 2B, a heavily n-type doped (n++) layer serves as emitter 206 and also provides the n-type tunnel junction layer of the pn diode tunnel junction connecting the first and second solar cells.

By way of illustration, one embodiment of a tandem solar cell comprises a first (lower) solar cell comprising a heavily p-type doped (p++) Si layer as a BSF, a lightly p-type doped (p+) Si layer as a base and a heavily n-type doped (n++) Si layer as an emitter. Alternatively, the emitter may be a lightly n-type doped (n+) layer of Si and the solar cell may further include an additional top layer of heavily n-type doped (n++) Si to serve as an n-type tunnel junction layer. The second solar cell may comprise a heavily p-type doped (p++) layer of an GaAs semiconductor as a p-type tunnel junction layer, whereby the n-type tunnel junction layer of the first solar cell and the p-type tunnel junction layer of the second solar cell form a pn diode tunnel junction. The second solar cell my further comprise a heavily p-type doped (p++) layer of an AlGaAs (for example $Al_{0.5}Ga_{0.5}As$) semiconductor as a separate BSF. (Alternatively, the BSF can itself provide the p-type tunnel junction layer of the pn diode tunnel junction. In which case, there would be no separate and distinct AlGaAs p-type tunnel junction layer.) The base of the second solar cell can comprise a lightly p-type doped (p+) AlGaAs semiconductor (for example $Al_{0.3}Ga_{0.7}As$), the emitter of the second solar cell can comprise a moderately n-type doped (n+) AlGaAs semiconductor (for example $Al_{0.3}Ga_{0.7}As$), and the window can comprise a heavily n-type doped (n++) AlGaAs semiconductor (for example $Al_{0.5}Ga_{0.5}As$). In addition, the second solar cell may include an upper contact layer of, for example, GaAs.

Figure 7:
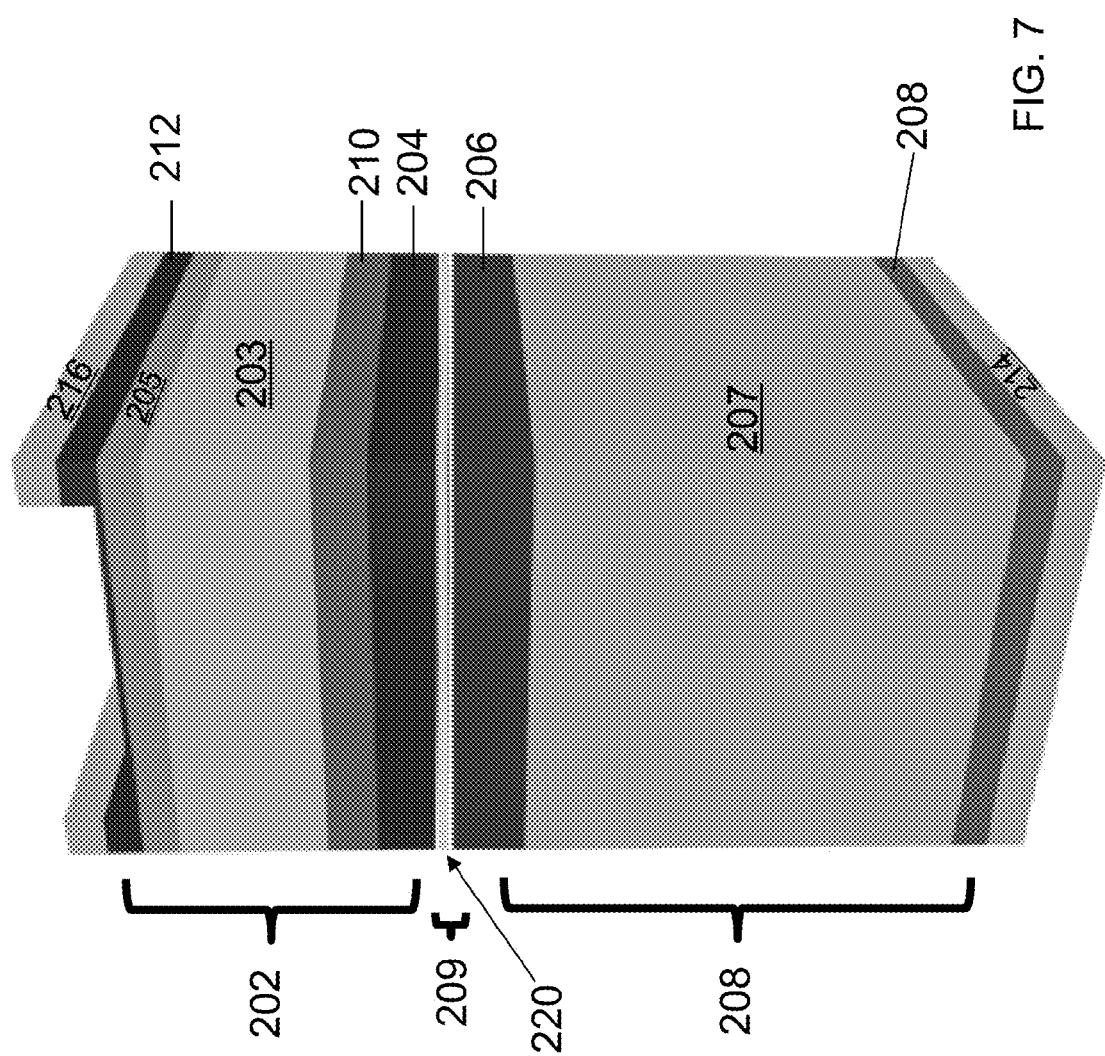
FIG. 7. Schematic diagram of an AlGaAs/Si tandem solar cell having an $Al_2O_3$ current tunneling layer integrated into its pn diode tunnel junction.

A schematic diagram of another embodiment of a dual junction tandem solar cell is shown in FIG. 7. The structure of the tandem solar cell in FIG. 7 is the same as that shown in FIG. 2B (and may comprise the same materials as that shown in FIG. 2B), except that the pn diode tunnel junction 209 connecting the neighboring solar cells is a three-layer heterostructure comprising p-type tunnel junction layer 204, n-type tunnel junction layer and a current tunneling layer 220 integrated between the n- and p-type tunnel junction layers. The current tunneling layer comprises an inorganic material, such as an oxide or nitride of a metal or metalloid element. In some embodiments of the tandem solar cells, the inorganic material is aluminum oxide. The inorganic material is characterized in that it has a bandgap that is wider than the bandgap of either of the semiconductors of the p-type and n-type tunnel junction layers and may be further characterized by the ability to passivate surface states of those semiconductors.

As used herein, the term "current tunneling layer" refers to a layer that is made from an appropriate material and that is sufficiently thin to act as a tunneling layer for electrons and/or holes. That is, unlike a typical dielectric medium, it allows both electrons and holes to pass through it, from a first solar cell to a second solar, via quantum tunneling. Thus, because metals would block the passage of holes, metals are not suitable materials for a current tunneling layer. However, a wide range of non-metal inorganic materials can meet these criteria. The inorganic material of the current tunneling layer may be a material that would act as a dielectric in its bulk form, but that is sufficiently thin in the current tunneling layer that it no longer acts as an electrical insulator. The current tunneling layer provides a sort of 'glue' that enhances the adhesion between the solar cells in the tandem solar cell stack. It is able to conform to the topography of the surfaces of the layers of semiconductor materials without introducing voids at the interfaces. In addition, the current tunneling layer can prevent the interdiffusion of the semiconductor materials from the semiconductor layers that it separates. This avoids the formation of an unwanted, intervening, cross-contaminated semiconductor interface layer.

Other advantages provided by this layer of inorganic material are that it may passivate the surfaces of the layers of semiconductor materials with which it is in contact, such that dangling bonds and interface states are minimized or eliminated. This property is useful because, when directly bonding two non-lattice matched single-crystalline materials, the chemical bonds formed between the two materials can create a large number of interface states. These interface states prevent the two materials from forming ideal rectifying junctions. However, when the inorganic material is inserted, the two materials are physically separated. If the layer is sufficiently thin and has the capability to chemically passivate the materials, the number of interface states can be reduced to levels such that both electrons and holes can efficiently tunnel through the layer.

The thickness of the current tunneling layer typically need only be on the order of the rms roughness of the surfaces of the n-type and p-type tunnel junction layers to which it binds. By way of illustration, in some embodiments, the current tunneling layer has a thickness in the range from about 1 to about 10 nm. This includes embodiments in which it has a thickness in the range from about 2 to about 10, from about 2 to about 5 nm or from about 1 to about 3 nm. Since the thickness of the current tunneling layer may not be uniform on an atomic scale, the thickness of the layer corresponds to the average thickness of the layer across the bonding interfaces of the heterojunction structure.

In some embodiments, the inorganic material of the current tunneling layer is an oxide. In such embodiments, the oxide can comprise, consist of, or consist essentially of, a metal oxide, an oxide of a semiconductor element or an oxide of a metalloid element. Examples of oxides that may be used in metal oxide current tunneling layers include, but are not limited to, those that can be deposited via ALD. Examples of such metal oxides include aluminum oxide ($Al_2O_3$), titanium oxide ($TiO_2$), hafnium oxide ($HfO_2$) and tantalum oxide. $SiO_2$ is another example. Alternatively, Chemical Vapor Deposition (CVD) growth can be used to form the oxide layer. A variety of oxides, including graphene oxide and molybdenum oxide ($MoO_3$), can be grown via CVD.

In some embodiments, the metal, semiconductor or metalloid elements present in the oxide are different from any metal, semiconductor or metalloid elements in the single-crystalline semiconductors of the pn diode tunnel junction layers between which the current tunneling layer is disposed. The inorganic oxide of the current tunneling layer can be a native oxide of a semiconductor material of either the n-type tunnel junction layer or the p-type tunnel junction layer that the current tunneling layer separates, as illustrated in Example 2. However, in some embodiments of the tandem solar cells, the current tunneling layer comprises an oxide that is not a native oxide of either the n-type tunnel junction layer or the p-type tunnel junction layer that the current tunneling layer separates, as also illustrated in Example 2, although it can include native oxides. (As used herein, the term native oxide refers to an oxide that would be monolithically formed on the single-crystalline material as the result of the oxidation of the single-crystalline material in an oxygen-containing environment. For example, $SiO_2$ is a native oxide of Si.) That is, in some embodiments the oxide does not comprise a native oxide of either the n-type tunnel junction layer or the p-type tunnel junction layer that the current tunneling layer separates, in some embodiments, the oxide does not consist essentially of a native oxide of either the n-type tunnel junction layer or the p-type tunnel junction layer that the current tunneling layer separates, and in some embodiments the oxide does not consist of a native oxide of either the n-type tunnel junction layer or the p-type tunnel junction layer that the current tunneling layer separates.

In other embodiments, the inorganic material of the current tunneling layer is a nitride. In such embodiments, the nitride can comprise, consist of, or consist essentially of, a metal nitride, a nitride of a semiconductor element or a nitride of a metalloid element. Examples of nitrides that may be used in nitride current tunneling layers include, but are not limited to, those that can be deposited via atomic layer deposition (ALD). Examples of such nitrides include aluminum nitride, silicon nitride, boron nitride and titanium nitride. In some embodiments, the metal, semiconductor or metalloid elements present in the nitride are different from any metal, semiconductor or metalloid elements of the pn diode tunnel junction layers between which the current tunneling layer is disposed.

In some embodiments, the current tunneling layer comprises two or more sub-layers, each of which comprises an inorganic material, provided, however, that the total combined thickness of the sub-layers is still low enough to allow for the tunneling of electrons and holes through the layer. For example, in a current tunneling layer comprising multiple sub-layers comprising inorganic oxides, the inorganic oxides can be selected such that one oxide passivates one of the two neighboring semiconductor materials (i.e., the n-type tunnel junction layer or the p-type tunnel junction layer), while another oxide passivates the other of the two neighboring semiconductor materials.

As illustrated in the Examples, the ultra-thin current tunneling layer provides a high quality medium that enhances the performance of the pn diode tunnel junction that connects neighboring cells in a tandem solar cell. With the inclusion of this current tunneling layer, the performance of the tandem solar cells can be significantly improved and the complexity of the integration of different solar cell materials can be significantly reduced.

In addition, the current tunneling layer is optically transparent to radiation having wavelengths that are to be absorbed by underlying solar cells in the tandem solar cell stack. Because the thickness of the current tunneling layer is on the order of an atomic-layer it helps to bond the solar cells together and to enhance the thermal conduction between the stacked cells. The high quality current tunneling layers also can minimize or eliminate unwanted carrier recombination due to interface trapping and obviate the need to use a Schottky contact or excessively high doping levels in the tunnel junctions that connect the solar cells, both of which can reduce the conversion efficiency of the tandem solar cells.

Figure 1:
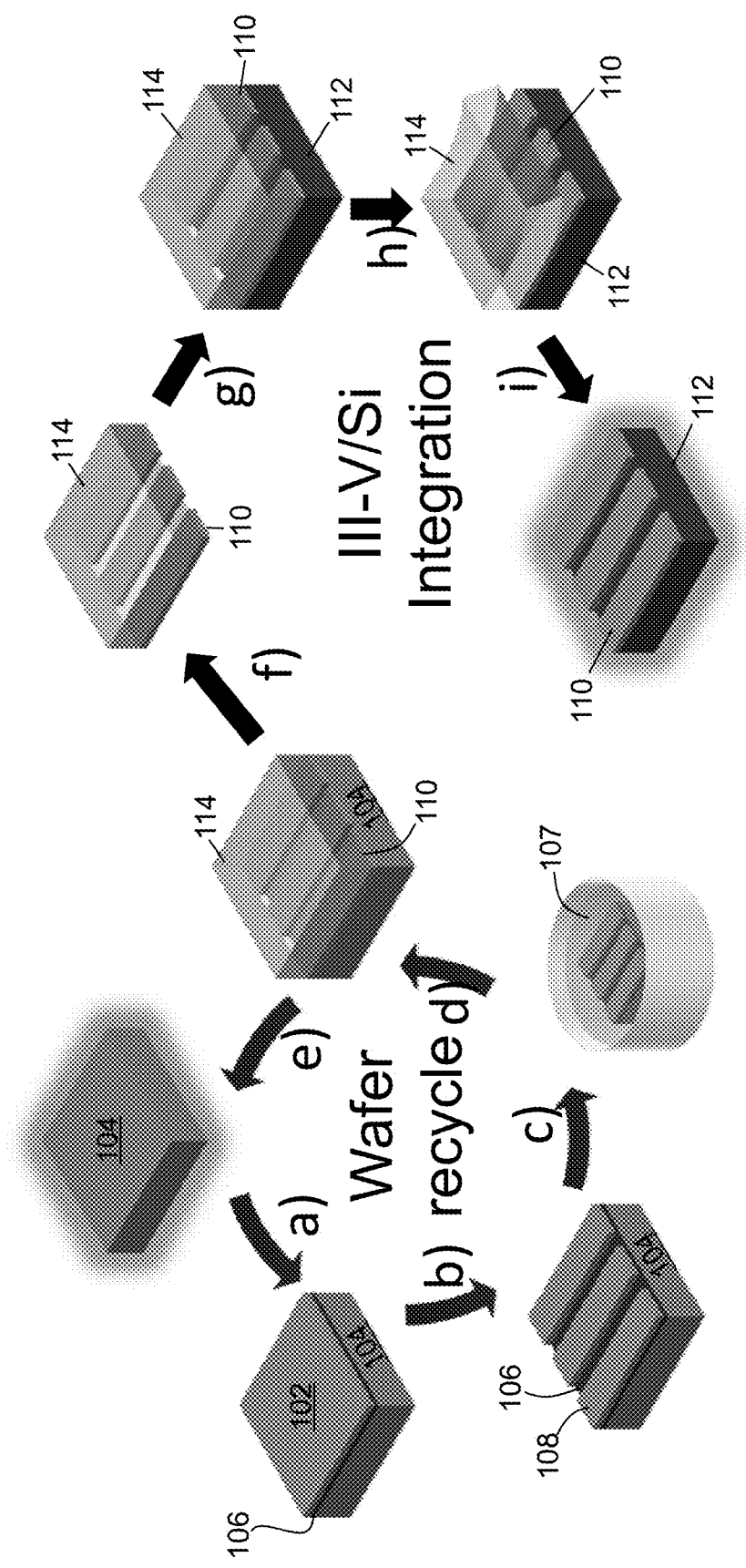
FIG. 1. Schematic process flow diagram of a Group III-V wafer recycle and a Group III-V/Si tandem solar cell integration using epitaxial lift-off (ELO) and print-transfer.

The tandem solar cells can be fabricated by using ELO to release epitaxially grown solar cells from their growth substrates and transferring the released solar cells onto another solar cell to form a solar cell stack. Using repeated ELO and transfer steps, a series of solar cells can be sequentially stacked on a base solar cell to form tandem solar cells comprising two or more solar cells connected by a series of pn diode tunnel junctions. In some embodiments, the same growth substrate is used to make successive solar cells in the tandem solar cell in order to reduce material waste. FIG. 1 is a schematic diagram showing the process flow of the ELO plus transfer printing process through which multiple solar cells can be integrated into a single tandem solar cell. In a first step (step a) a heterostructure comprising multiple crystalline semiconductor layers is epitaxially grown on a layer of sacrificial material 106 on a growth substrate 104 to provide the various layers of a solar cell. These epi-layers will comprise the active layers of a pn junction solar cell, including a base layer and an emitter layer. They may also include a BSF layer, a window layer, one or more buffers layers, a distinct tunnel junction layer and/or a contact layer, as described above. Optionally, the multilayered structure is then patterned into a plurality of individual solar cell strips 108, each of which can be used to provide an upper solar cell in an array of tandem solar cells. The patterning of solar cell strips 108 should extend down to sacrificial layer 106, as shown in step (b). Sacrificial layer 106 is then removed by, for example, etching it away in a liquid etchant 107, and allowing released solar cell strips 110 to settle onto growth substrate 104 (step c). A transfer stamp 114, such as a polydimethylsiloxane (PDMS) stamp, is then pressed onto the exposed upper surfaces of released solar cell strips 110 to which it adheres, as shown in step d. Released solar cell strips 110 are then lifted away from growth substrate 104 (step f) and pressed onto the upper surface of a pre-fabricated base solar cell 112 (step g). At this point, growth substrate 104 can be recycled (step e) by growing another layer of sacrificial material on its surface, and subsequently growing another solar cell on the new sacrificial layer. Transfer stamp 114 is then peeled away (step h) to provide an array of tandem solar cells, each of which comprises one of the solar cell strips 110 on base solar cell 112 (step i). Using this method a plurality of single junction solar cells or an array of single junction solar cells can be grown and then transfer printed onto another underlying solar cell or onto an array of underlying solar cells to build a tandem solar cell or an array of tandem solar cells. As an alternative to growing each solar cell individually and then transferring it individually onto the tandem solar cell stack, a multijunction solar cell stack can be epitaxially grown in a monolithic structure on the sacrificial layer and then the monolithic structure can be print transferred as a unit onto a base solar cell.

In embodiments of the tandem solar cells that include current tunneling layers in their pn diode tunnel junctions, an additional step is carried out before step g in which the current tunneling layer is formed on the upper surface of the lower solar cell (or on the lower surface of a transferred solar cell; or both). For example, if the current tunneling layer comprises a material that can be deposited via ALD, an ALD step can be inserted prior to the transfer printing step.

The process flow of FIG. 1 is particularly well-suited for fabricating hybrid tandem solar cells in which the materials from which the first solar cell are comprised are not lattice matched to the materials from which the second solar cell are comprised. One example of such a tandem solar cell is one in which the first solar cell is a silicon-based solar cell and the second solar cell is an AlGaAs-based solar cell, as illustrated in the Examples.

It should be noted that, although the fabrication of a tandem solar cell is illustrated here using ELO in combination with transfer printing. Tandem solar cells comprising current tunneling layers integrated to their pn diode tunnel junctions can also be fabricate using other techniques, including wafer bonding techniques.

In should also be noted that although the solar cells and tandem solar cells are referred to throughout as "solar" cells, the radiation adsorbed by the cells and converted into electricity need not come from the sun or even correspond to wavelengths across the solar spectrum.

Example 1

This example demonstrates a method to realize a hybrid III-V/Si tandem photovoltaic cell by combining ELO and print-transfer assisted bonding methods. The bonding interface is optically transparent, and thermally and electrically conductive. The adoption of ELO enables the III-V wafers, upon which the III-V solar cells are grown, to be recycled and reused, thus promising to further lower the cost of III-V/Si photovoltaic panels. For demonstration, high crystal-quality, micrometer-thick, AlGaAs solar cell are lifted off, transferred, and directly bonded onto a Si solar cell, without the use of any adhesive or bonding agents.

ELO and Print-Transfer Bonding

The step-by-step processing flow to accomplish Group III-V/Si solar cell integration using ELO is shown in FIG. 1. To begin with, a III-V solar cell film comprising a III-V-based heterostructure 102 is homogeneously epitaxially grown on a substrate, such as a GaAs substrate 104, with a special interlayer, for example AlAs 106 (FIG. 1, step a). (See, X. Sheng, M. H. Yun, C. Zhang, A. M. Al-Okaily, M. Masouraki, L. Shen, S. Wang, W. L. Wilson, J. Y. Kim, P. Ferreira, X. Li, E. Yablonovitch, J. A. Rogers, *Adv. Energy Mater.* 2015, 5, n/a.) This interlayer, or so-called sacrificial layer, can be etched away by a gas or liquid etchant, while the III-V film of interest remains intact. The undercut etching of the sacrificial layer in a liquid etchant is a complex process involving chemical reactions, dissolution of byproducts, and mass transport. (See, J. J. Schermer, G. J. Bauhuis, P. Mulder, W. J. Meulemeesters, E. Haverkamp, M. M. a. J. Voncken, P. K. Larsen, *Appl. Phys. Lett.* 2000, 76, 2131; A. T. J. van Niftrik, J. J. Schermer, G. J. Bauhuis, P. Mulder, P. K. Larsen, M. J. van Setten, J. J. Attema, N. C. G. Tan, J. J. Kelly, *J. Electrochem. Soc.* 2008, 155, D35 and W. Chang, C. P. Kao, G. A. Pike, J. A. Slone, E. Yablonovitch, *Sol. Energy Mater. Sol. Cells* 1999, 58, 141.) It can be affected by many factors such as the geometry of the sample, the concentration of etchant 107, and the chemical composition of the sacrificial layer. Though the undercut can be done on the wafer scale to obtain a large freestanding III-V heterostruture film, patterned III-V heterostructure strips 108 with exposed undercut layer require a much shorter etching time. FIG. 1, steps b, c and d show the patterning of a III-V based heterostucture 108 into strips, the etching of the sacrificial layer in HF and the released patterned strips on the growth substrate, respectively. After the undercut etching is finished, the freestanding III-V strips 110 are ready for a variety of applications including flexible electronics.

Next, the patterned and released III-V strips 110 are bonded to a Si solar cell 112 in a controllable style using a transfer-print method (steps f-i), while the leftover growth substrate 104 can be recycled and reused (FIG. 1, step e). First, a PDMS stamp 114 was used to pick-up the patterned and released III-V strips 110 from growth substrate 104 (FIG. 1, step f). Then, stamp 114 was used to print patterned and released III-V strips 110 onto Si solar cell 112 (FIG. 1, step g). Lastly, removal of PDMS stamp 114 yielded an array of the hybrid III-V/Si tandem solar cells (FIG. 1, steps h-i). No bonding or adhesive agents were used in this process. The bonding strength exclusively depends on the van der Waals forces between the surfaces of the III-V and Si. To ensure strong bonding strength, the two surfaces should be very smooth and clear of particles. The residual strain in the released III-V film also matters. Too much strain can make the III-V film curve up and fail to bond. It is much easier for nanomembranes to stay conformal to uneven target surfaces than thick and stiff films. So, for III-V films of a few micrometers thickness in photovoltaic applications, the requirement for an immaculate surface is stringent.

Direct bonding is advantageous because light scattering and absorption at the heterogeneous interface can be minimized, while heat dissipation of the solar cells can remain efficient. Additionally, the interface is electrically active. With proper III-V materials and doping concentrations, the III-V/Si interface can be very conductive. Photocurrent can flow vertically across the interface, instead of laterally within a base or emitter layer. So there is no current spreading issue in the base of the top junction and the emitter of the bottom junction.

Tandem Solar Cell Structure

The dual-junction hybrid AlGaAs/Si tandem solar cells were chosen for investigation. Si was designated as the carrier wafer and one solar cell junction of choice because of its low cost, and good mechanical and thermal properties. The selection of the AlGaAs semiconductor for the other junction was based on its energy bandgap, since there is no lattice match restriction. As the carrier wafer, Si can serve as either a top junction or a bottom junction. As a guideline, the Shockley-Queisser efficiency of a dual-junction tandem solar cell depends on the bandgap of each junction, as shown in FIG. 2A. Due to the current matching constraint and relaxation of hot carriers, the favored bandgap combination is limited to a very small range. For a Si bandgap of 1.12 eV, it works best with a material of bandgap ~1.8 eV to achieve current matching and decent efficiency. In this work, AlGaAs with a bandgap of 1.8 eV, i.e. Al content of 30%, was selected as the top cell. Such a bandgap combination is close to the efficiency optima shown in FIG. 2A. Though the bandgap of InGaP can also be tuned to 1.8 eV, its cost would be higher than that of AlGaAs. The selective wet etching of AlAs over AlGaAs is more challenging in the III-V family. Although demonstrated here by bonding an AlGaAs-based solar cell onto a Si-based solar cell, this approach is generalizable other III-V-based solar cells.

To fabricate the tandem solar cell, the AlGaAs-based solar cell 202 was grown on a GaAs substrate and transferred and bonded onto the top of the bottom Si solar cell 208. A schematic diagram of the structure of the dual junction solar cell is shown in FIG. 2B. As discussed above, the top solar cell comprised a photo-absorbing pn junction comprising AlGaAs (i.e., it is an AlGaAs-based solar cell) 202 and included a p++ GaAs tunnel junction layer 204 at its bottom end. Layer 204 is designed to form a conductive pn junction interface with the n++ emitter 206 of the bottom Si cell 208. The AlGaAs-based solar cell also had an n+ GaAs contact layer on its top end. The two GaAs layers sandwiching the AlGaAs heterostructure served as protection during wet etching. Upon finishing the transfer, the p++ GaAs/n++ Si pn diode tunnel junction 209 was formed to connect top AlGaAs-based solar cell 202 and bottom Si-based solar 208 cell.

The AlGaAs-based solar cell structure with AlAs sacrificial layer was grown on a GaAs substrate via metal-organic chemical vapor deposition (MOCVD). The structure included (from bottom to top): a 25 nm thick p-GaAs (Be, $p=5\times10^{19}$ $cm^{-3}$) p-type tunnel junction layer, a 30 nm thick p-$Al_{0.5}Ga_{0.5}As$ (Be, $p=8\times10^{18}$ $cm^{-3}$) back surface field (BSF) layer, a 1300 nm thick p-$Al_{0.3}Ga_{0.7}As$ (Be, $p=1\times10^{17}$ $cm^{-3}$) base layer, a 150 nm thick n-$Al_{0.3}Ga_{0.7}As$ (Si, $n=1\times10^{18}$ $cm^{-3}$) emitter layer, a 20 nm thick n-$Al_{0.5}Ga_{0.5}As$ (Si, $n=5\times10^{18}$ $cm^{-3}$) window layer and a 300 nm thick n-GaAs (Si, $n=5\times10^{18}$ $cm^{-3}$) top contact layer. The materials, dopant type and concentration and thickness for each of the layers is summarized in the table of FIG. 8A.

As the substrate onto which the AlGaAs-based solar cell was transferred, the bottom Si solar cell was fabricated in advance because the Si has to undergo high temperature processing. It started with a 300 μm-thick p-type double-side polished Si wafer. The n++ emitter was diffusively doped by $PClO_3$. The top surface was degenerated and ready to form a conductive tunnel junction with the thereafter transferred p++ GaAs layer of the top solar cell. A back-surface-field (BSF) was formed by doping the backside of the Si wafer with a p-type dopant and an ohmic contact was formed on the backside of the BSF by annealing an Al-paste onto the surface thereof.

Transfer AlGaAs Onto Si

Figure 3A:
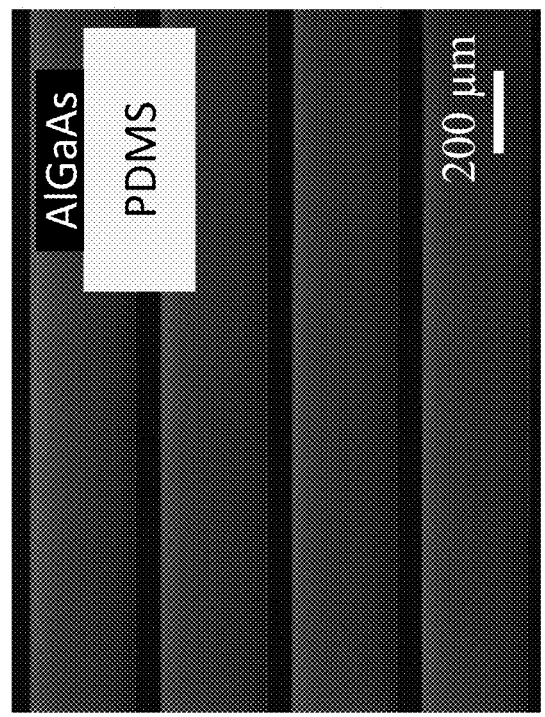
FIG. 3A. Cross-sectional Scanning Electron Microscope (SEM) images of a partially undercut AlAs sacrificial layer. The top 1.8 μm cell film was suspended after the AlAs below it was etched away.

Prior to transfer printing, the GaAs/AlGaAs/GaAs heterostructure film was patterned into strips by Inductively Coupled Plasma (ICP) etching to expose the AlAs layer. An HF based ELO method was adopted to release the n+ GaAs/AlGaAs/p++ GaAs structure by undercutting the AlAs sacrificial layer. The lateral etching selectivity of AlAs over the AlGaAs layer in highly diluted HF is over 50:1, which is sufficient to lift off GaAs/AlGaAs/GaAs strips several hundreds of micrometers wide. For a 250 μm wide strip, it took about 2 hours in 1:250 diluted HF to finish the undercut. There is no restriction for the length of the strips. Few-millimeter-long strips have been lifted off. HF residual was removed by rinsing the undercut sample under water several times. FIG. 3A shows a cross-sectional SEM image of a 1.8 μm-thick top solar cell film, half of which sat on the AlAs sacrificial layer and half of which was suspended after the partial undercut procedure.

Figure 3B:
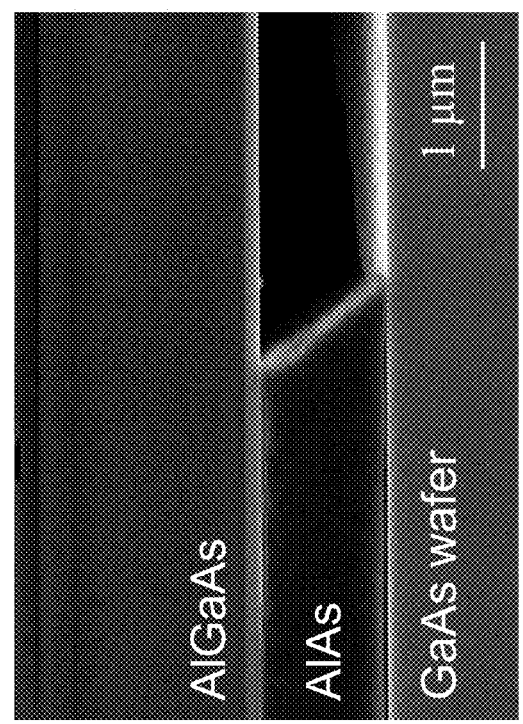
FIG. 3B. AlGaAs-based solar cell films evenly adhered on a polydimethylsiloxane (PDMS) stamp after pick-up.
Figure 3C:
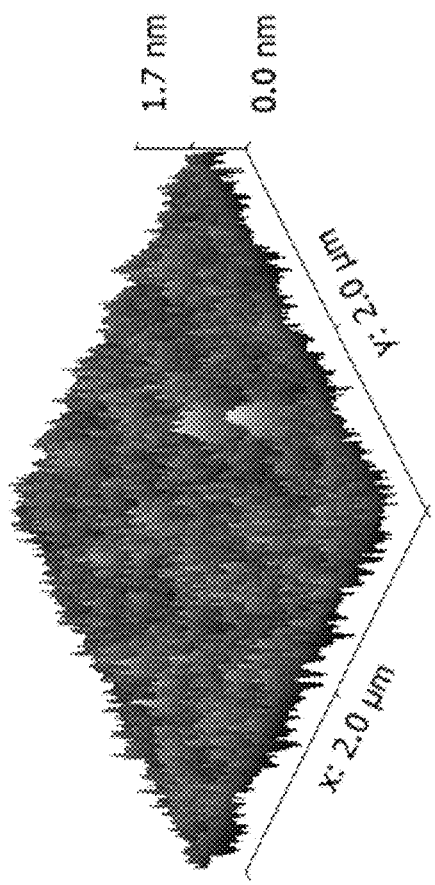
FIG. 3C. Atomic Force Microscope (AFM) roughness mapping for the backside surface of a p++ GaAs tunnel junction layer on the rear surface of the AlGaAs-based solar cell.
Figure 3D:
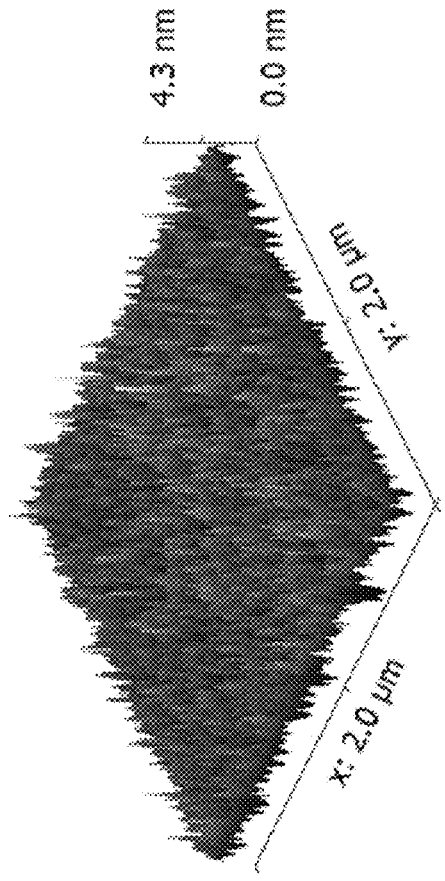
FIG. 3D. AFM roughness mapping for the top surface of the Si solar cell.
Figure 3F:
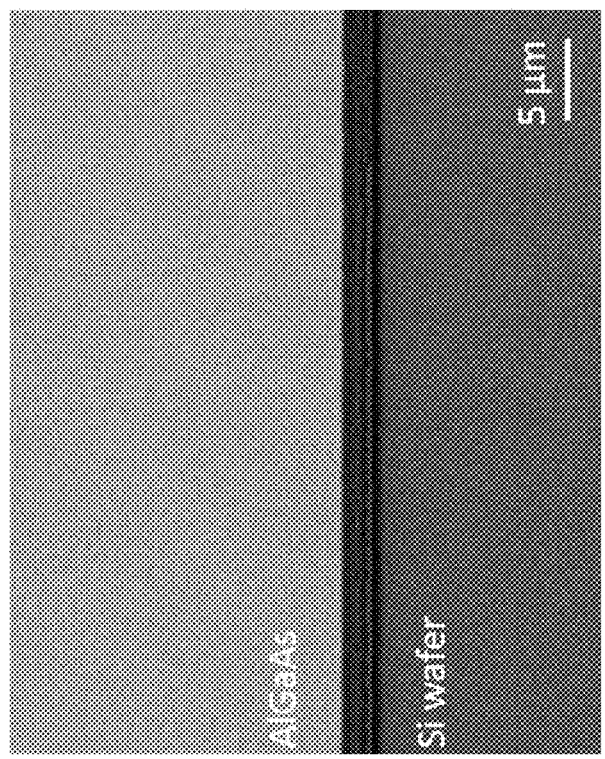
FIG. 3F. Cross-sectional SEM image (45° tilt) of a transferred AlGaAs-based solar cell film on the bottom Si cell.
Figure 3E:
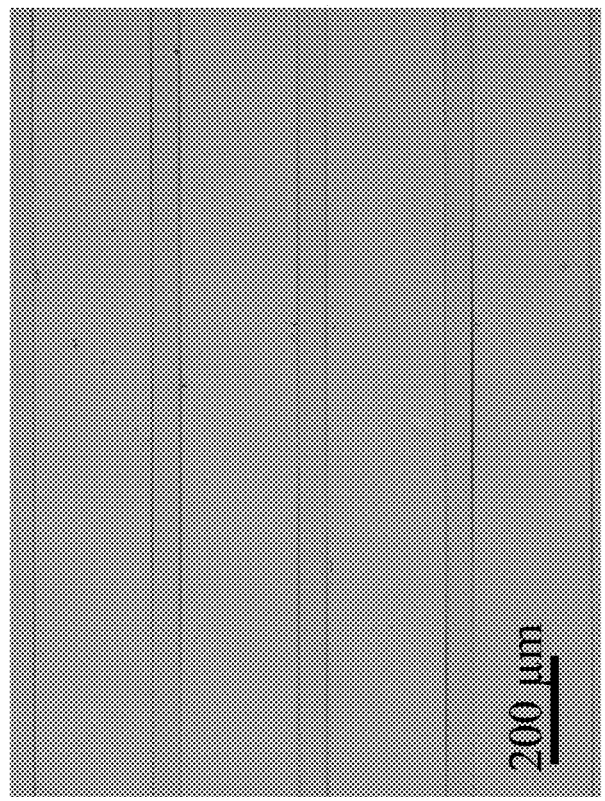
FIG. 3E. Optical microscope image of transferred AlGaAs-based solar cell films on a bottom Si solar cell.
Figure 3G:
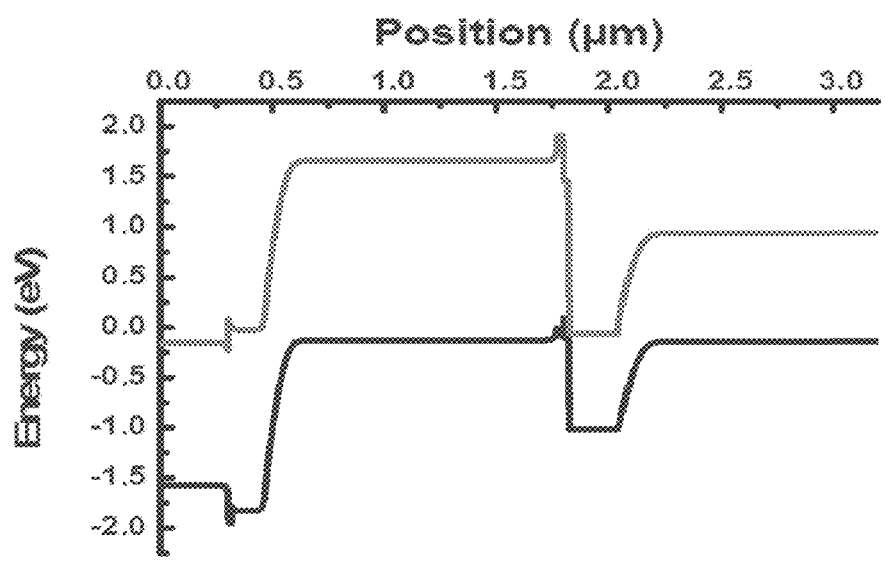
FIG. 3G. Cross-sectional SEM image of the transferred AlGaAs-based solar cell film on the bottom Si solar cell and the corresponding equilibrium band structure. The multiple layers of the tandem AlGaAs/Si solar cell are shown.
Figure 3G:
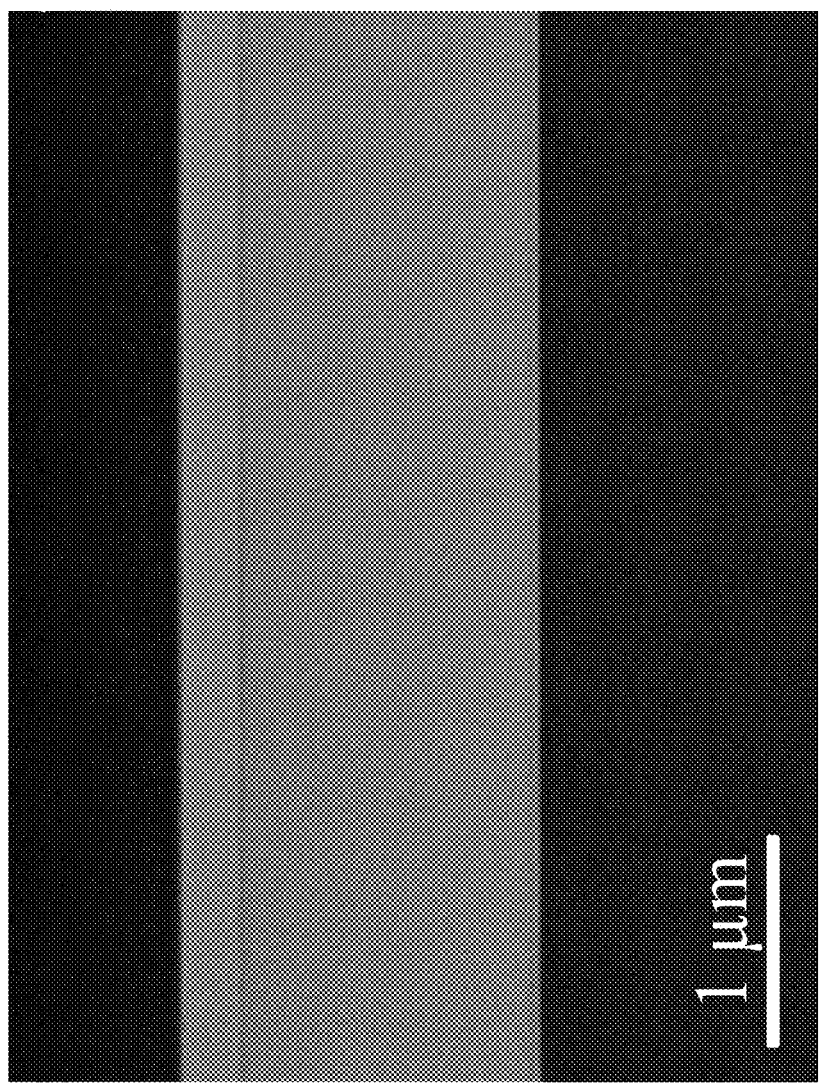
Figure 3H:
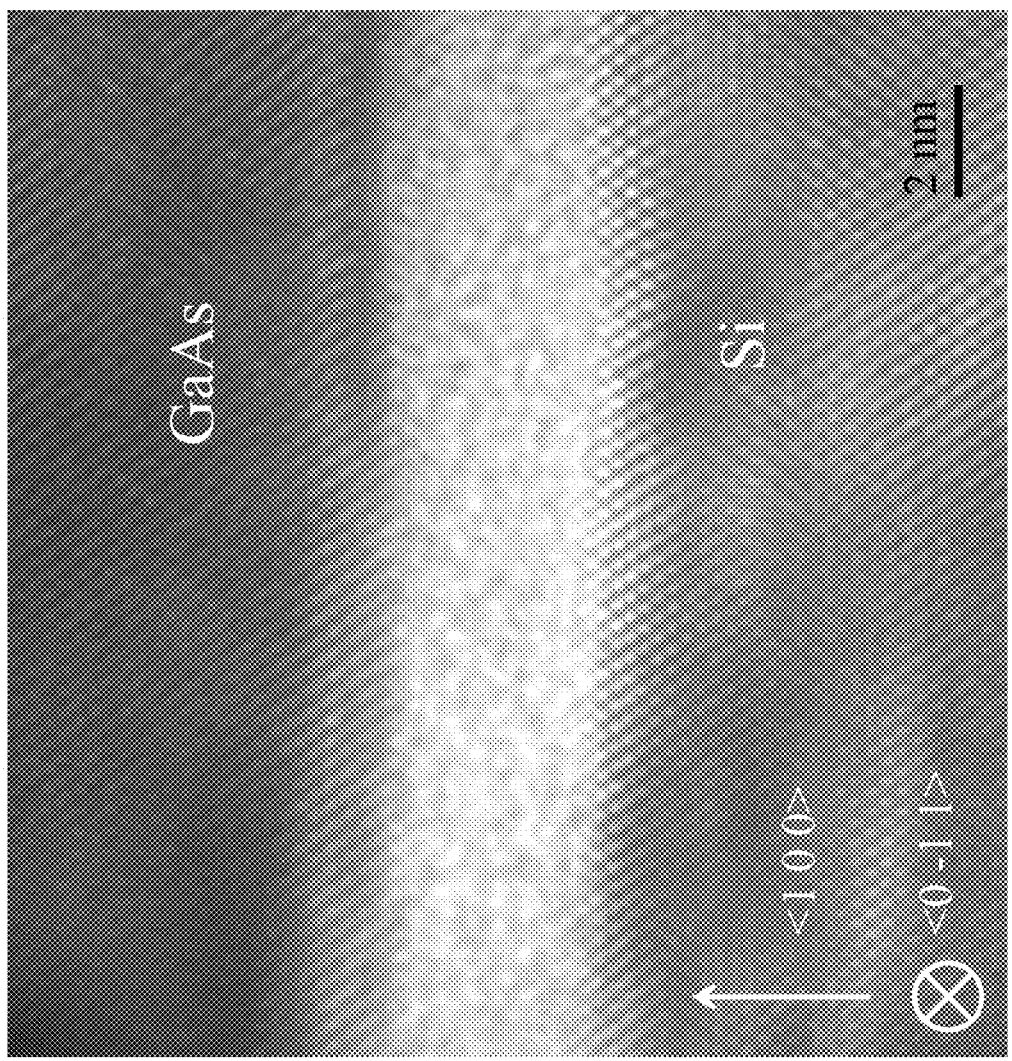
FIG. 3H. The cross-sectional Transmission Electron Microscope (TEM) image of the GaAs/Si heterojunction.
Figure 3I:
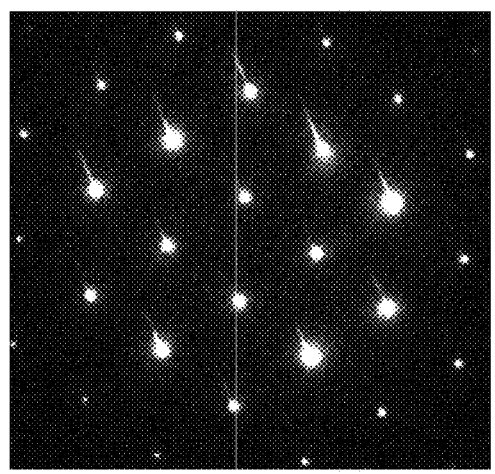
FIG. 3I. The selected area electron diffraction patterns for the Si.
Figure 3J:
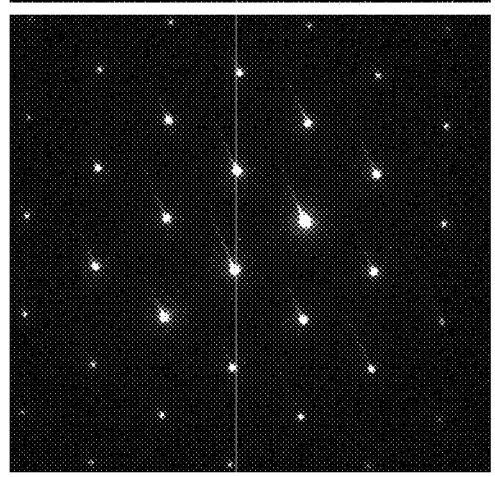
FIG. 3J. The selected area electron diffraction patterns for the GaAs.
Figure 3K:
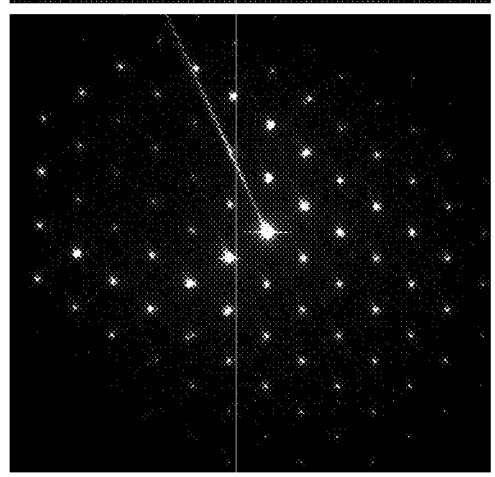
FIG. 3K. The selected area electron diffraction patterns for the region around the p++ GaAs/n++ Si heterojunction interface.

Once released, the GaAs/AlGaAs/GaAs strips were picked up by the PDMS stamp. The backsides of the strips were very clean, as shown in FIG. 3B. AFM measurement confirmed that the backside surfaces of the strips and top surface of the bottom Si solar cell were very smooth (FIGS. 3C and 3D). The GaAs/AlGaAs/GaAs strips were then transferred onto the Si solar cell using a print-transfer method without any adhesive or bonding agents. A top view optical microscopic image of the resulting tandem AlGaAs/Si solar cell is shown in FIG. 3E. The AlGaAs-based solar cell remained bonded to the Si solar cell due to the van der Waals forces between the adjacent p++ GaAs and n++ Si surfaces. Though there was strain in the 1.8 μm thick n+ GaAs/AlGaAs/p++ GaAs structure, its bonding with Si was feasible. The bonding process was carried out in a class 100 lithography bay in a clean room to minimize particulate contaminants. To further strengthen the bonding, the sample was baked on a hot plate to remove any liquid residue, followed by annealing in nitrogen at a temperature in the range of 200° C. to 500° C. The 500° C. annealed AlGaAs-based solar cell stayed conformal to the Si surface, as shown in FIG. 3F. The zoom-in cross-sectional SEM image in FIG. 3G clearly shows the multiple layers of the AlGaAs/Si tandem solar cell. The corresponding equilibrium band structure is shown on the right. FIG. 3H shows the transmission electron microscopy image of the cross section of the bonded p++ GaAs/n++ Si heterojunction interface. There is a ~3.5 nm amorphous layer between the single crystal GaAs and Si, thin enough to form a conductive ohmic contact at the heterojunction interface. A series of selected area electron diffraction patterns for the Si, GaAs, and around the GaAs/Si heterojunction interface are shown in FIGS. 3I-3K. These diffraction patterns demonstrate and verify that the GaAs and Si above and below the amorphous layer are perfect single crystals. These observations demonstrate that the single crystal quality of the GaAs and Si was not compromised during the ELO-transfer-assisted bonding process and that there is no clear lattice distortion dislocation around the bonded heterojunction.

Figure 4A:
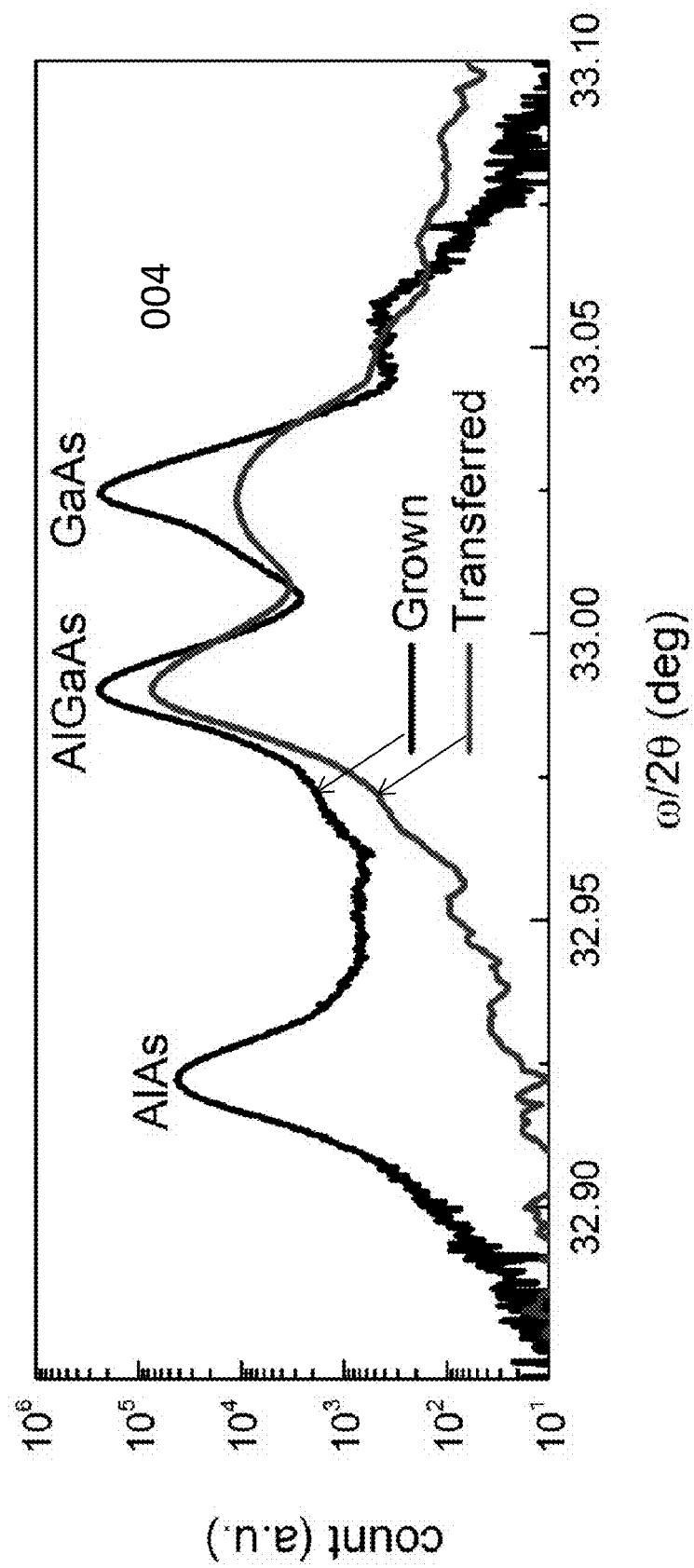
FIG. 4A. X-Ray Diffraction (XRD) spectra for a grown GaAs/AlGaAs/GaAs heterostructure on an AlAs/GaAs sacrificial layer/growth substrate and the transferred GaAs/AlGaAs/GaAs heterostructure on the Si bottom cell.
Figure 4B:
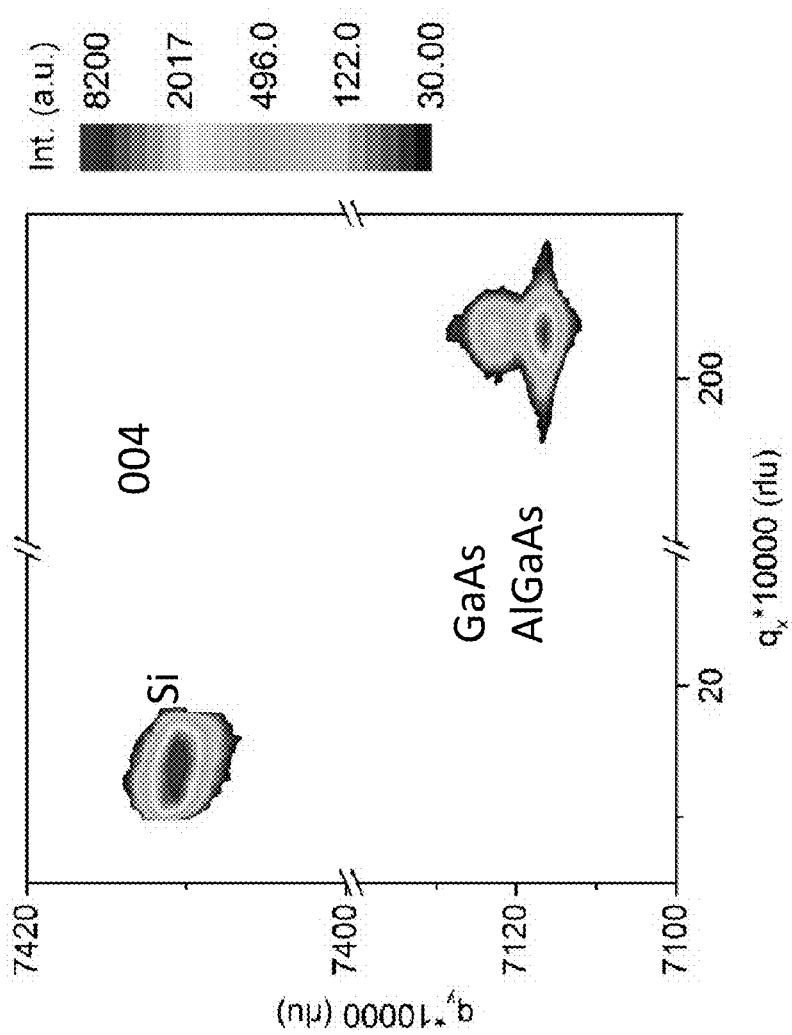
FIG. 4B. Reciprocal space mapping (RSM) (004) of the transferred GaAs/AlGaAs/GaAs heterostructure on the Si bottom cell.
Figure 4C:
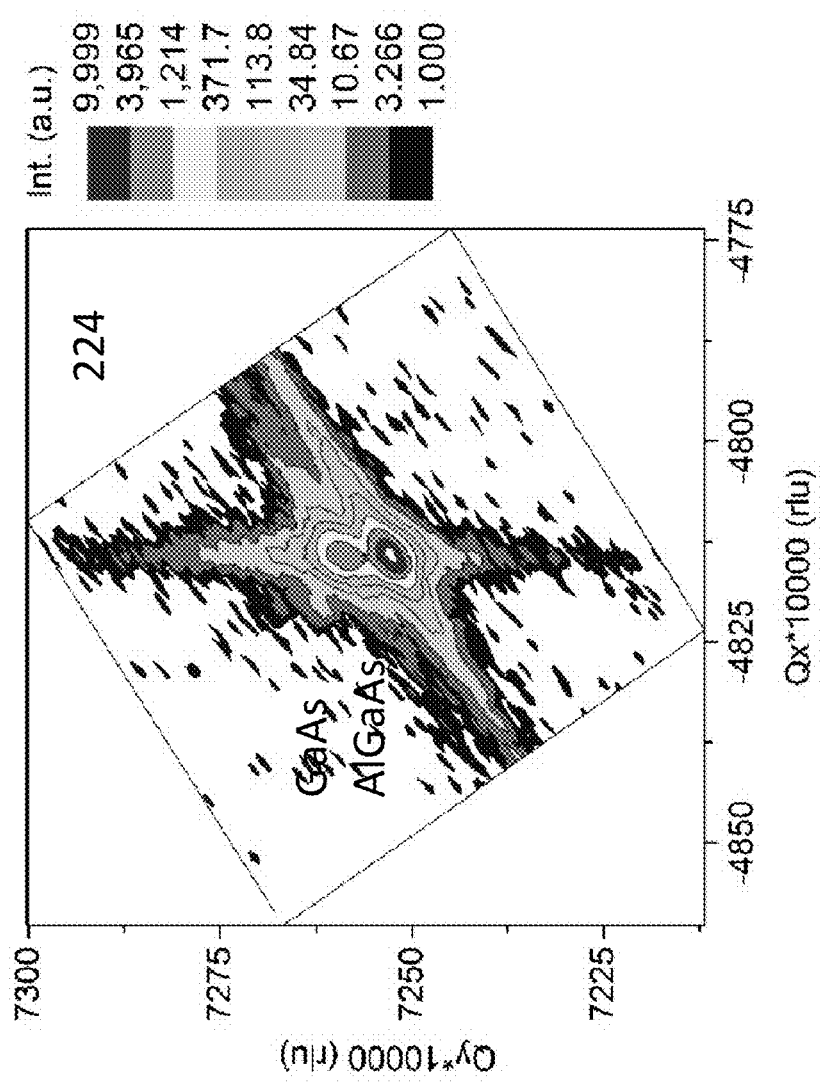
FIG. 4C. RSM (224) for the AlGaAs-based solar cell, including the p++ GaAs tunnel junction layer.

The crystal quality of transferred III-V solar cell strips on the target Si solar cell wafer was verified by X-ray diffraction. Along with the GaAs wafer peak, the triple crystal (004) ω/2θ scan of the epitaxial wafer shows the peak of the AlGaAs layer and the AlAs sacrificial layer, as shown in FIG. 4A. The Al-content ratio was 0.3 and 1.0, respectively. After the AlGaAs was transferred onto the Si solar cell, the AlAs peak disappeared. The GaAs cap layer peak was weaker than the AlGaAs peak because it was relatively thinner. RSM was measured to show the relative position of the AlGaAs to the Si wafer. FIG. 4B shows the (004) RSM, where the AlGaAs (100) was about 1.5 degree offset with respect to the Si (100), due to the GaAs epitaxial substrate miscut. The (224) RSM in FIG. 4C shows that the GaAs contact layer remained coherent with the AlGaAs layer after ELO and print-transfer, so there was still strain in the transferred layer.

Device Fabrication and Results

After bonding the AlGaAs-based solar cells with the Si-based solar cell, the remaining device components of the dual-junction tandem solar cells were fabricated using conventional methods. Because the Al-contact on the bottom of Si can be etched by photoresist developers or acids, it should be covered by photoresist during certain processing steps. The AlGaAs window, base and Si emitter were exposed by plasma etching. For four terminal tandem solar cells, AuGe/Ni/Au, Ti/Pt/Au, and Ni/Au metal contacts were deposited by e-beam evaporator onto the GaAs contact layer, AlGaAs base, and n++ Si emitter, respectively. For two terminal tandem solar cells, only the AuGe/Ni/Au contact was deposited. The Al-paste on the backside of Si wafer served as the ground contact. The isolation of the cells was accomplished by dry etching the excess area. The AlGaAs-based solar cells stayed on the Si solar cell substrate during the process, including the contact annealing, even though the metal alloying process may introduce strains.

Figure 5A:
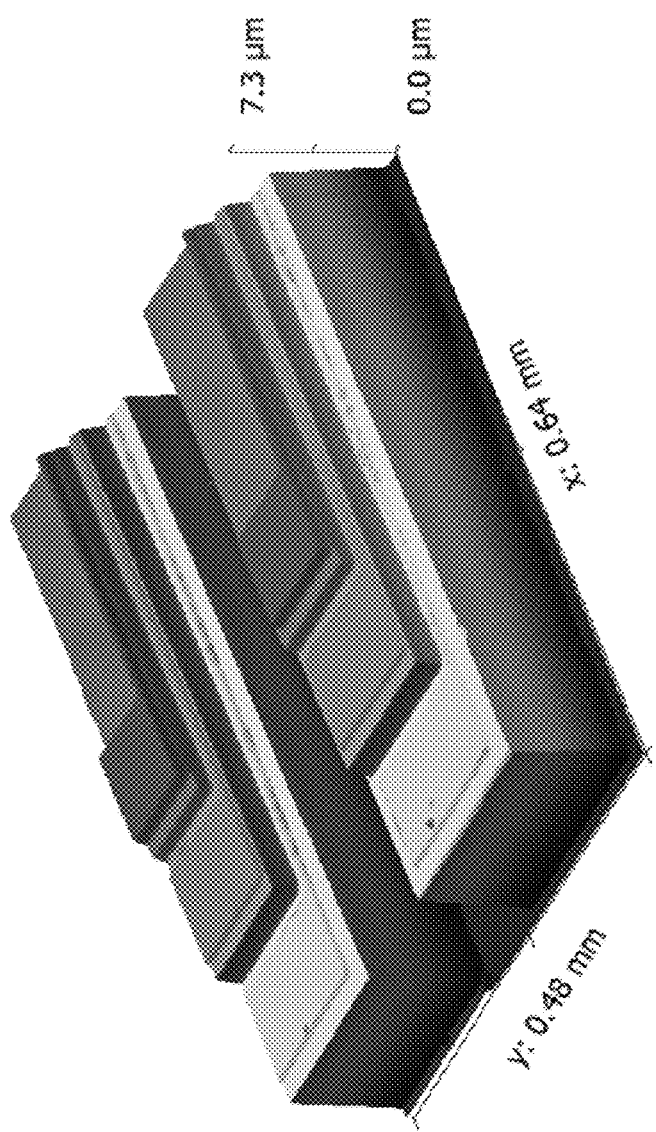
FIG. 5A. The 3D structure of a finished AlGaAs/Si tandem solar cell scanned by a Zygo white light interferometer.
Figure 5B:
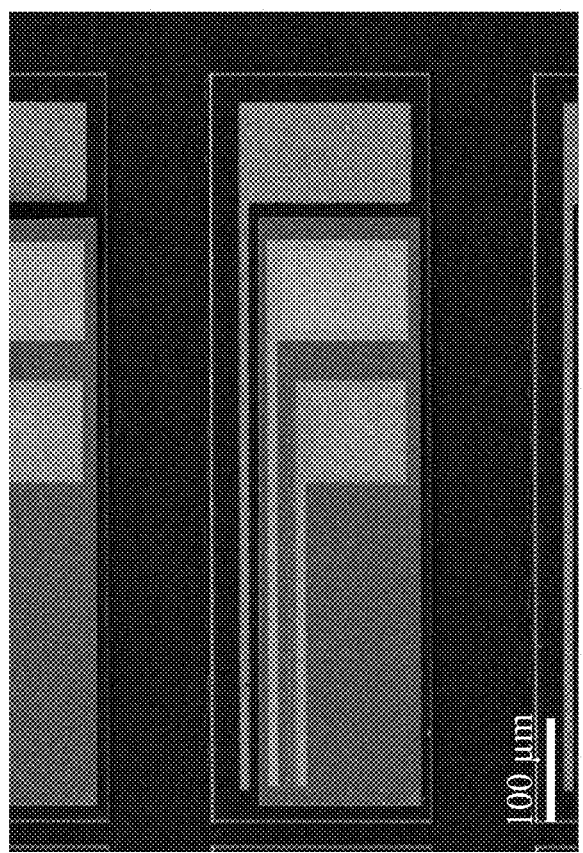
FIG. 5B. Top view SEM image of a finished four terminal tandem solar cell.
Figure 5D:
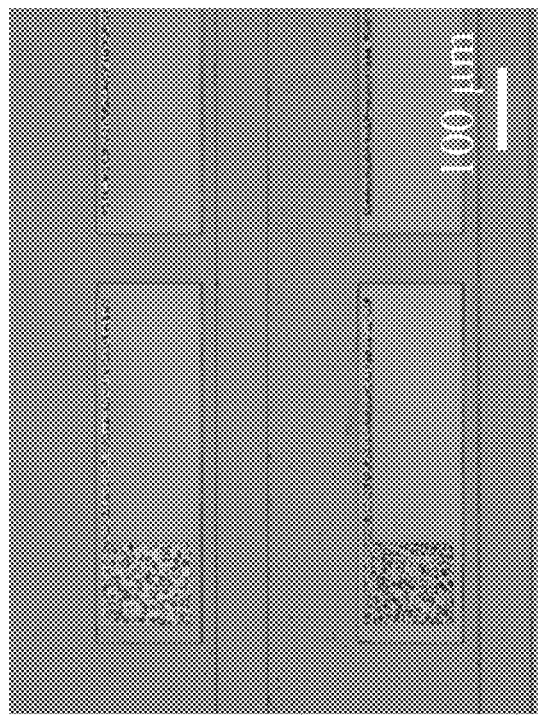
FIG. 5D. Top view optical microscopic image of the finished two terminal tandem solar cells.
Figure 5C:
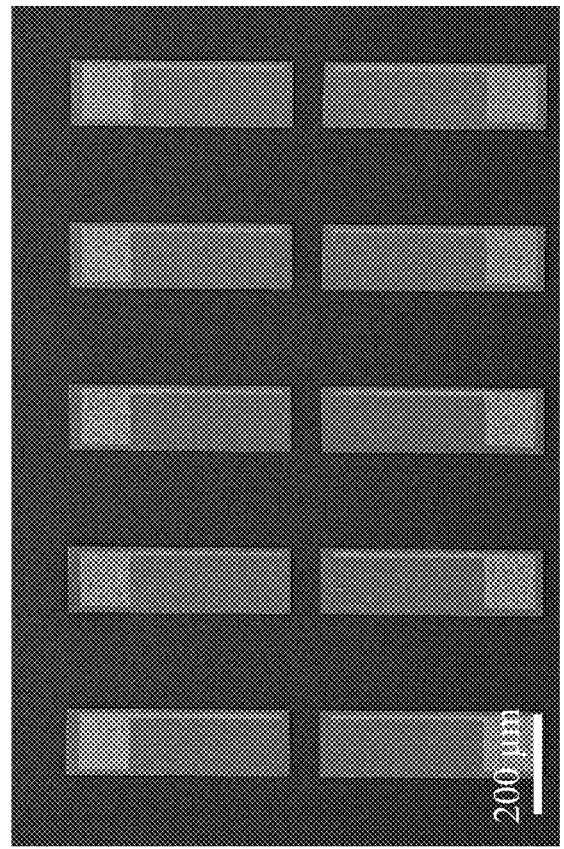
FIG. 5C. Top view SEM image of the finished two terminal tandem solar cells.

Two finished tandem solar cells are shown schematically in FIG. 5A. A 3D structure image of a tandem solar cell measured by Zygo white light interferometer shows the 1.8 μm AlGaAs-based solar cell on the top of the Si solar cell. The tandem solar cell array was made from different AlGaAs strips for four-terminal and two-terminal tandem solar cells (FIGS. 5B and 5C). An optical microscopic image of the finished two-terminal tandem solar cells is shown in FIG. 5D, where the trace of AlGaAs strips is clear. To fully utilize the AlGaAs area, bigger solar cells can be fabricated. The rough edges can be removed to reduce leakage and surface recombination.

Figure 6A:
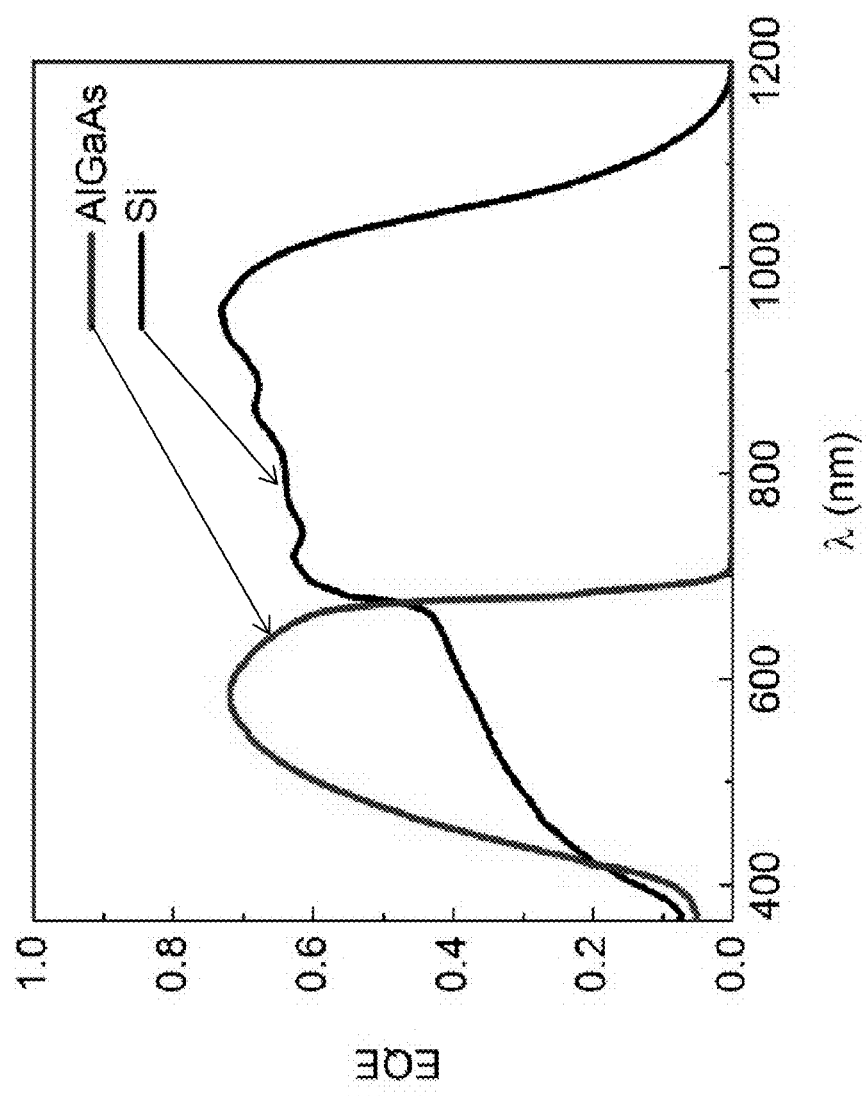
FIG. 6A. The External Quantum Efficiency (EQE) for each junction of the AlGaAs/Si tandem solar cell.
Figure 6B:
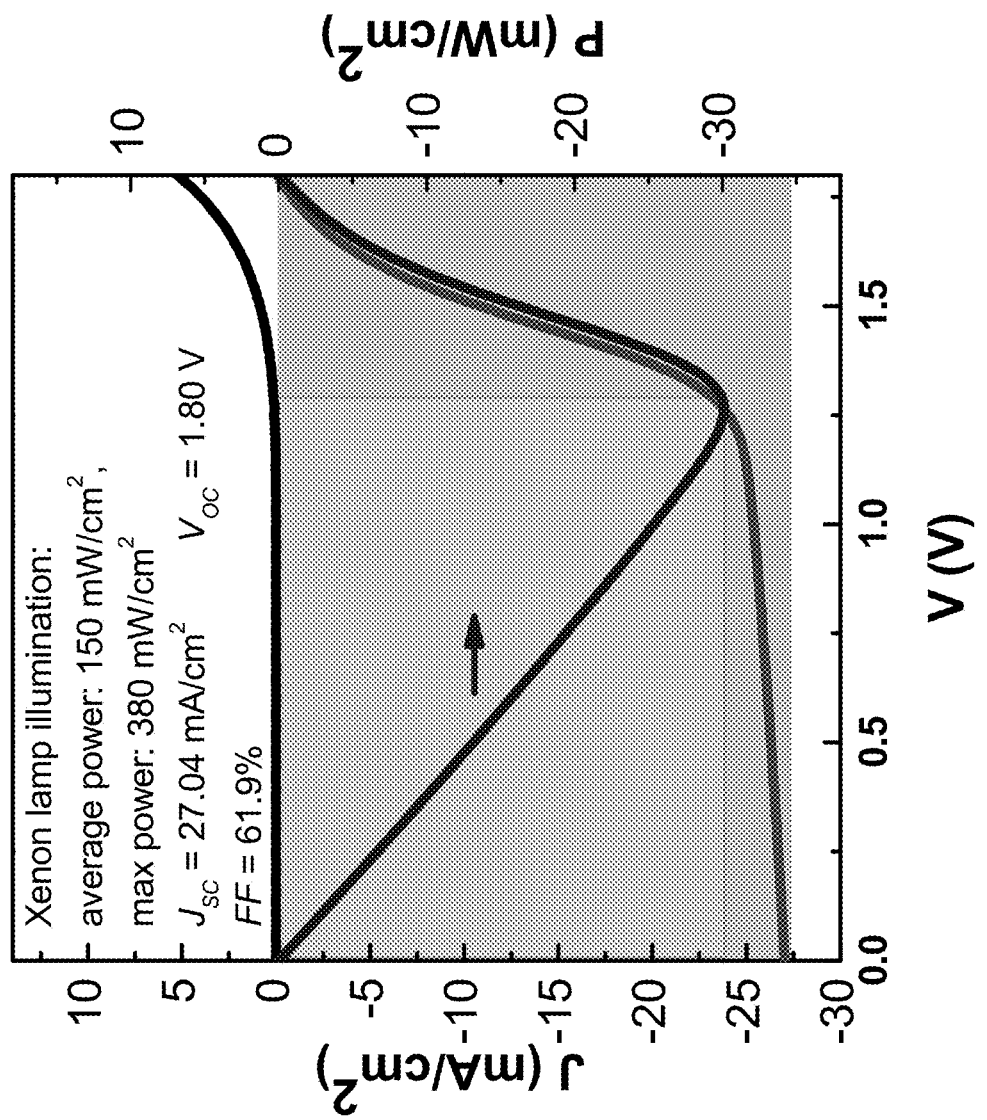
FIG. 6B. The IV characterization of the AlGaAs/Si tandem solar cell under dark and illumination conditions.

The device properties were measured after the fabrication to minimize oxidation of the AlGaAs. The four-terminal tandem solar cell was used for the test of the fabrication and EQE. FIG. 6A shows the EQE of each junction of the tandem solar cell without an anti-reflection (AR) layer. Considering the small area of the device, the pad area was not accounted for in the EQE measurement. The top AlGaAs cell exhibited a response edge corresponding to its bandgap. The response of the bottom Si cell at short wavelengths was due to the relatively smaller size of the AlGaAs-based solar cell. The dark and illuminated I-V curves of the tandem solar cells are shown in FIG. 6B. The open-circuit-voltage was 1.80 eV (under a Xenon lamp with average power: 150 mW/cm$^2$ and maximum power: 380 mW/cm$^2$), which is the sum of both the top AlGaAs-based solar cell and bottom Si-based solar cell. This open-circuit-voltage is more than 3 times that of a single Si solar cell. The interface can be further improved to reduce the serial resistance and, thus, boost the fill factor.

Summary

Using a combined ELO and print-transfer assisted bonding method, micrometer-thick AlGaAs-based solar cells were bonded with a Si solar cell substrate, without the use of any bonding agents, to form an array of AlGaAs/Si tandem solar cells. The bonding resulted in an electrically conductive and optically transparent pn interface. The device had good efficiency and an open circuit voltage of 1.8 V. This approach can also be applied to other III-V-based solar cells, and thus, can be used to fabricate a variety low cost and high efficiency III-V/Si multijunction solar cells for non-concentrated photovoltaic applications.

Example 2

This example illustrates the fabrication and performance of a dual junction tandem solar cell comprising a silicon-based lower solar cell and an AlGaAs-based upper solar cell. In the embodiment of the tandem solar cell illustrated here, the pn diode tunnel junction connecting the lower and upper solar cell includes ALD deposited aluminum oxide current tunneling layer between the n++ doped tunnel junction layer of the lower solar cell and the p++ doped tunnel junction layer of the upper solar cell. As discussed below, the integration of the current tunneling layer into the pn diode tunnel junction significantly improves the performance of the tandem solar cell relative to a tandem solar cell without the current tunneling layer.

Experimental.

AlGaAs Top Tandem Solar Cell Preparation

As in Example 1, a Si (bandgap 1.12 eV) based solar cell was chosen as the lower solar cell and an AlGaAs (bandgap 1.8 eV) based solar cell, comprising $Al_{0.3}Ga_{0.7}As$ as the base and emitter materials, was chosen as the upper solar cell in the solar cell stack in order to achieve the most effective solar conversion efficiency based on the Shockley-Queisser limit. Heavily p-type doped $Al_{0.5}Ga_{0.5}As$ was used as the BSF in the upper solar cell and a layer of heavily p-type doped GaAs was used as a p-type tunnel junction layer, while heavily n-type doped $Al_{0.5}Ga_{0.5}As$ was used as the window material in the upper solar cell. The AlGaAs-based solar cell further included a GaAs upper contact layer.

Due to the lattice mismatch between AlGaAs and Si, the AlGaAs cannot be grown directly on top of the Si uniformly and with high quality. Instead, an AlGaAs-based solar cell comprising a p++ tunnel junction layer on its bottom end was grown epitaxially on top of a GaAs source wafer with an intervening sacrificial AlAs layer. After the upper solar cell was grown, the AlAs layer was removed via an HF based ELO process to release the upper solar cell from its growth substrate.

Before releasing the AlGaAs-based upper solar cell from the GaAs processing wafer, the AlGaAs stack was patterned into strips by ICP $Ar/Cl_2$ etching to expose the AlAs sacrificial layer. After the AlAs was exposed, the whole wafer was quickly immersed in a dilute HF solution to etch away the AlAs sacrificial layer. Once the strips were released from the GaAs wafer, a rubber stamp was applied to pick up the strips gently. Right before printing the released strips onto the lower Si solar cell, the strips were rinsed with diluted HF solution while still on the rubber stamp. The strips were then transfer printed onto a thin film of $Al_2O_3$ (described below) on the upper surface of the n++ contact layer of the Si solar cell by contacting them with the $Al_2O_3$ film and applying pressure.

A schematic diagram of the resulting tandem solar cell is shown in FIG. 7 and tables listing the material, dopant type and concentration, and the thickness of each layer in the upper and lower solar cells are shown in FIGS. 8A and 8B, respectively. As shown in these figures, the structure of the upper AlGaAs-based solar cell on the GaAs wafer comprised an $Al_{0.3}Ga_{0.7}As$ pn junction, which forms a p-i-n structure, sandwiched between heavily doped and thin $Al_{0.5}Ga_{0.5}As$ layers, which acts as a window and a BSF layer. A GaAs layer was integrated above the window layer to protect the Al based structure from the HF solution used to etch the AlAs sacrificial layer during the ELO process and is important for achieving a fine and smooth surface for the subsequent transfer printing process.

Si Bottom Tandem Solar Cell Preparation

Figure 9C:
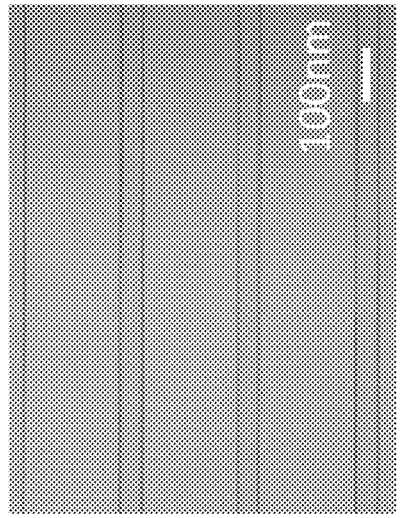
FIG. 9C. Image of the AlGaAs/Si tandem solar cells after the completion of transfer printing.
Figure 9A:
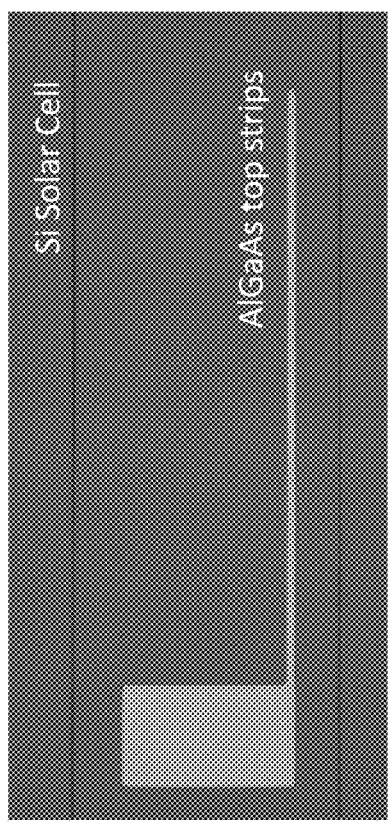
FIG. 9A. Light field optical image of AlGaAs-based solar cell strips on a Si-based solar cell surface.
Figure 9B:
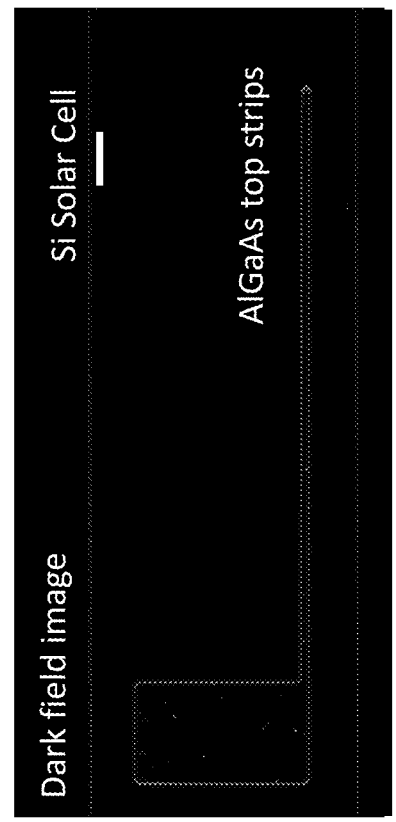
FIG. 9B. Dark field image of the strips showing that the interface between the solar cells is clean and free of particles.
Figures 10A, 10B:
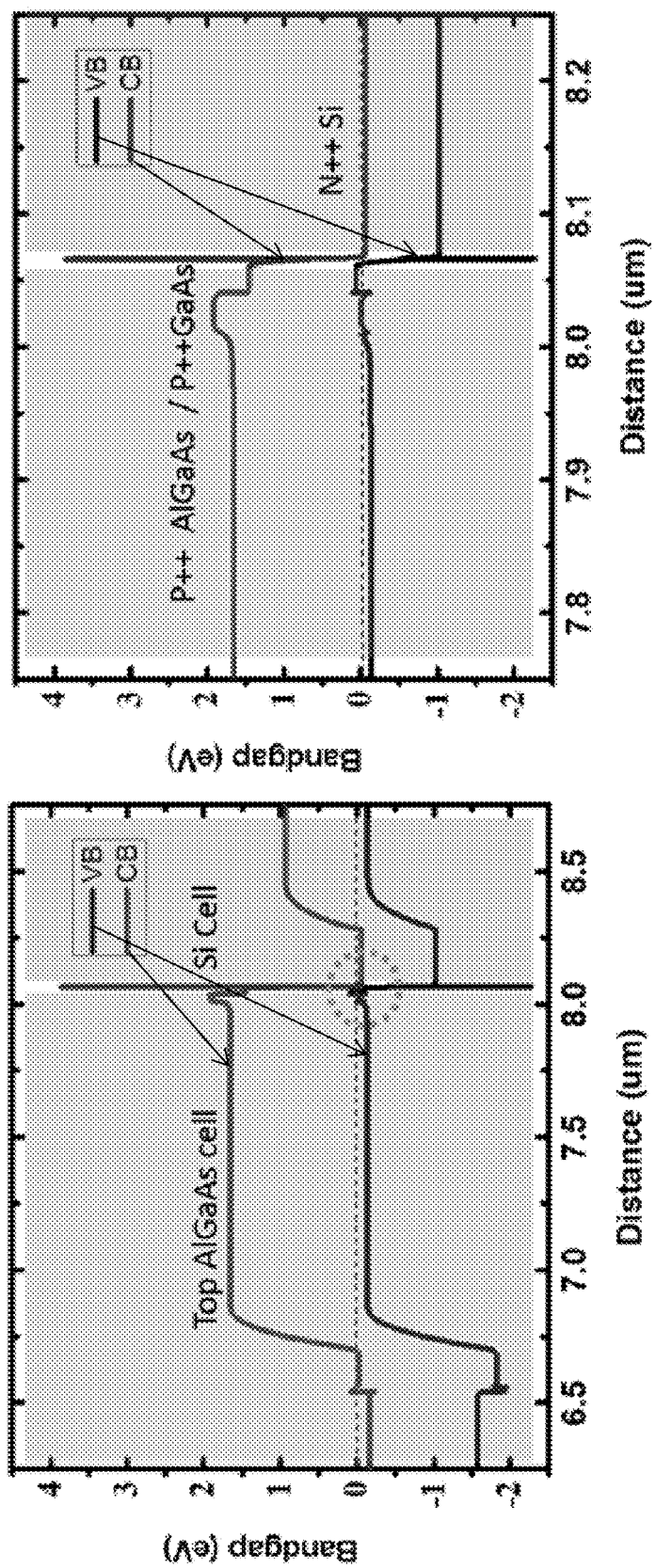
FIG. 10A. The band diagram layout for an AlGaAs/Si tandem solar cell.
FIG. 10B shows an enlarged portion of the band diagram around the p++ tunnel junction layer/$Al_2O_3$ current tunneling layer/n++ emitter layer interfaces in the tandem solar cell.

A standard 300 μm p-Si substrate was used as the source substrate for the lower Si solar cell. In order to generate the p-i-n structures on the Si substrate, an n++ top tunnel junction layer was formed in the upper surface of the p-Si substrate via gas phase $POCl_3$ diffusion with a 5 nm screen oxide. The whole Si substrate was then annealed for 12 hours in a gas diffusion chamber to drive in the dopant. The estimated surface doping exceeded $10^{21}/cm^3$ with a tunnel junction layer depth of around 100 nm. A p++ BSF layer was formed at the bottom surface of the Si solar cell and then a 10 μm Al paste was painted on the back side of the Si solar cell to provide the p++ contact pad. Once the p++ contact pad was formed, after the Al paste was annealed in the vacuum chamber, the top surface of the Si-based solar cell was cleaned by ultrasonication in acetone and high power oxygen plasma to remove any residue generated during the diffusion process. Right before the transfer printing of the AlGaAs solar cell strips, pure HF solution was applied to the top surface of the Si substrate, followed by a rinse of the n++ tunnel junction layer with the DI water. The Si solar cell was then placed in an ALD chamber to grow a thin (~2 nm thick) current tunneling layer of $Al_2O_3$ on its upper surface. An image of the tandem solar cells, after transfer printing and bonding the AlGaAs solar cell strips to the $Al_2O_3$ current tunneling layer on the silicon solar cell, is shown in FIG. 9C. FIGS. 9A and 9B show light and dark field optical images, respectively, of the clean, printed AlGaAs-based upper solar cell strips on top of the lower Si solar cell. The dark field image shows that the interface is free of particles in between the AlGaAs solar cell strips and the Si surface. FIG. 10A shows the band diagram layout for the resulting tandem solar cells. FIG. 10B shows an enlarged portion of the band diagram around the p++ tunnel junction layer/$Al_2O_3$ current tunneling layer/n++ emitter layer interfaces of the tandem solar cell.

AlGaAs/Si Tandem Solar Cell Fabrication

Once the AlGaAs solar cell strips were printed on top of the Si solar cell, $Au_{0.12}Ge_{0.88}$/Ni/Au 70 nm/30 nm/200 nm was deposited on top of the GaAs windows of the AlGaAs solar cell strips to provide top metal contact pads. Before annealing to form the ohmic contacts, a self-aligned ICP etching technique was applied to thin down the top GaAs (300 nm) capping layer. This capping layer was thinned down to enhance light transmission. Once the capping layer was thinned down, a 450° C. RTA was used to form the ohmic contacts on the top metal pads. It was noticed that increased pressure on the rubber stamp during transfer can significantly improve the yield of the RTA process. Once the metal contacts were annealed, a 2 ρm thick photoresist, s1827, was cast on the tandem solar cells with the active regions exposed and developed. The tandem solar cells were then defined with ICP etching and the boundary areas of the AlGaAs stacks that underwent HF etching were removed to improve the quality of the upper AlGaAs-based solar cells. After AlGaAs stacks were defined and etched, the bottom Si was also etched via $SF_6$ plasma etching to isolate each tandem solar cell. The exposed sidewalls of the tandem solar cells were passivated with a thin oxide to reduce undesired recombination at the sidewall area. The top metal pads, which were now covered with the oxide, were then opened with a short HF dip, using the photoresist as the mask. The whole device was then placed on top of the Au coated substrate for probing and measurement.

Results.

The thin layer of aluminum oxide integrated into the pn diode junction region between the lower and upper solar cells of the tandem solar cells provided enhanced performance and reduced the complexity of the integration of different materials into the tandem solar cells.

The thin, high quality ALD $Al_2O_3$ layer was optically transparent to wavelengths of light to be absorbed and converted by the Si solar cell, improved the adhesion between the upper and lower solar cells, provided excellent electrical conductivity between the upper and lower solar cells and enhanced the thermal conduction in between the stacked solar cells. In addition, the high quality tunneling oxide eliminates problems of recombination due the interface trapping and avoids using a Schottky contact or excessive highly doping levels in the junction area between the solar cells. Both of these can reduce the output ability of the tandem solar cells.

Figure 11:
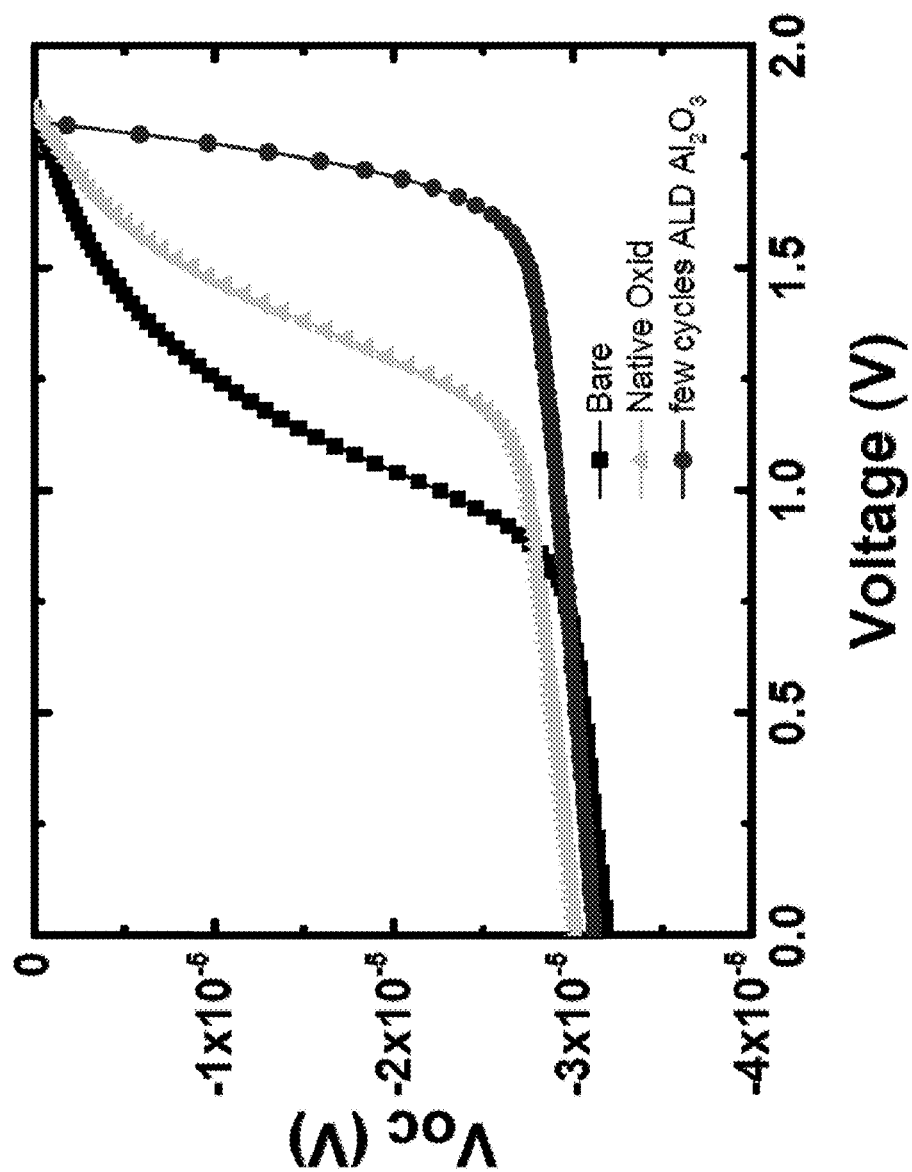
FIG. 11. A comparison of the IV performance under AM1.5G solar spectrum of the tandem solar cell of Example 2 with a comparative tandem solar cell comprising the same upper and lower solar cells, but lacking the ALD $Al_2O_3$ layer, and another comparative tandem solar cell comprising the same upper and lower solar cells, but with a thin layer of native oxide between the upper and lower solar cells, instead of an ALD $Al_2O_3$ layer.

FIG. 11 shows a comparison of the IV performance under AM1.5G solar spectrum of the tandem solar cell of this example with a comparative tandem solar cell comprising the same upper and lower solar cells, but lacking the ALD $Al_2O_3$ layer, and another comparative tandem solar cell comprising the same upper and lower solar cells, but with a thin layer of native oxide between the upper and lower solar cells, instead of an ALD $Al_2O_3$ layer. It can be seen that the AlGaAs/Si tandem solar cell without a current tunneling oxide layer gave a huge "S" neck in the IV curve and the poorest fill factor performance. There was a modest improvement in the IV curve for the tandem solar cell with native oxide in pn diode heterojunction, but there was also a tiny current depression when the voltage was close to the $V_{oc}$. The tandem cell with the ALD $Al_2O_3$ current tunneling layer provided almost perfect electrical performance. It gave the highest $I_{sc}$ and $V_{oc}$. Notably, the form of the IV curve is close to a rectangular shape and gives a excellent fill factor, as high as 75%.

Figure 12A:
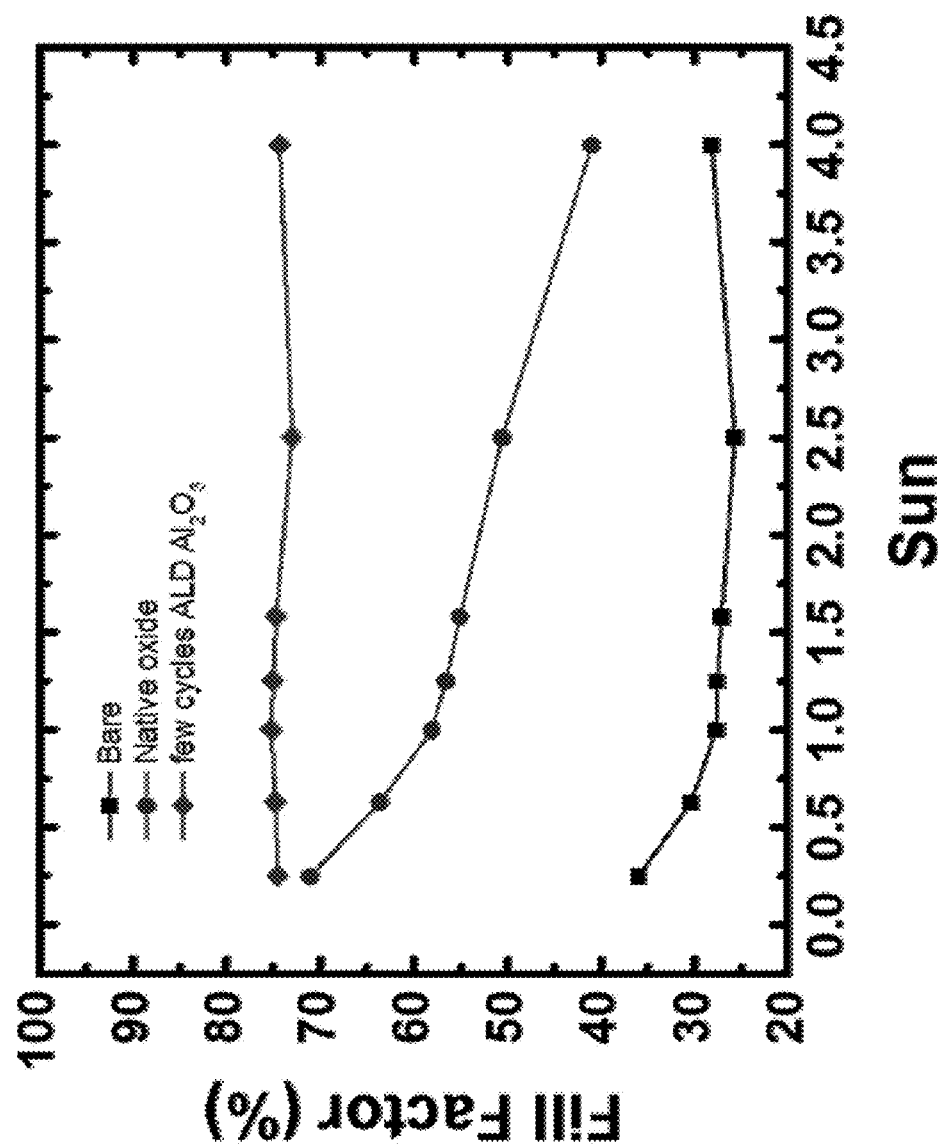
FIG. 12A. The fill factors for the AlGaAs/Si tandem solar cell of Example 2.
Figure 12B:
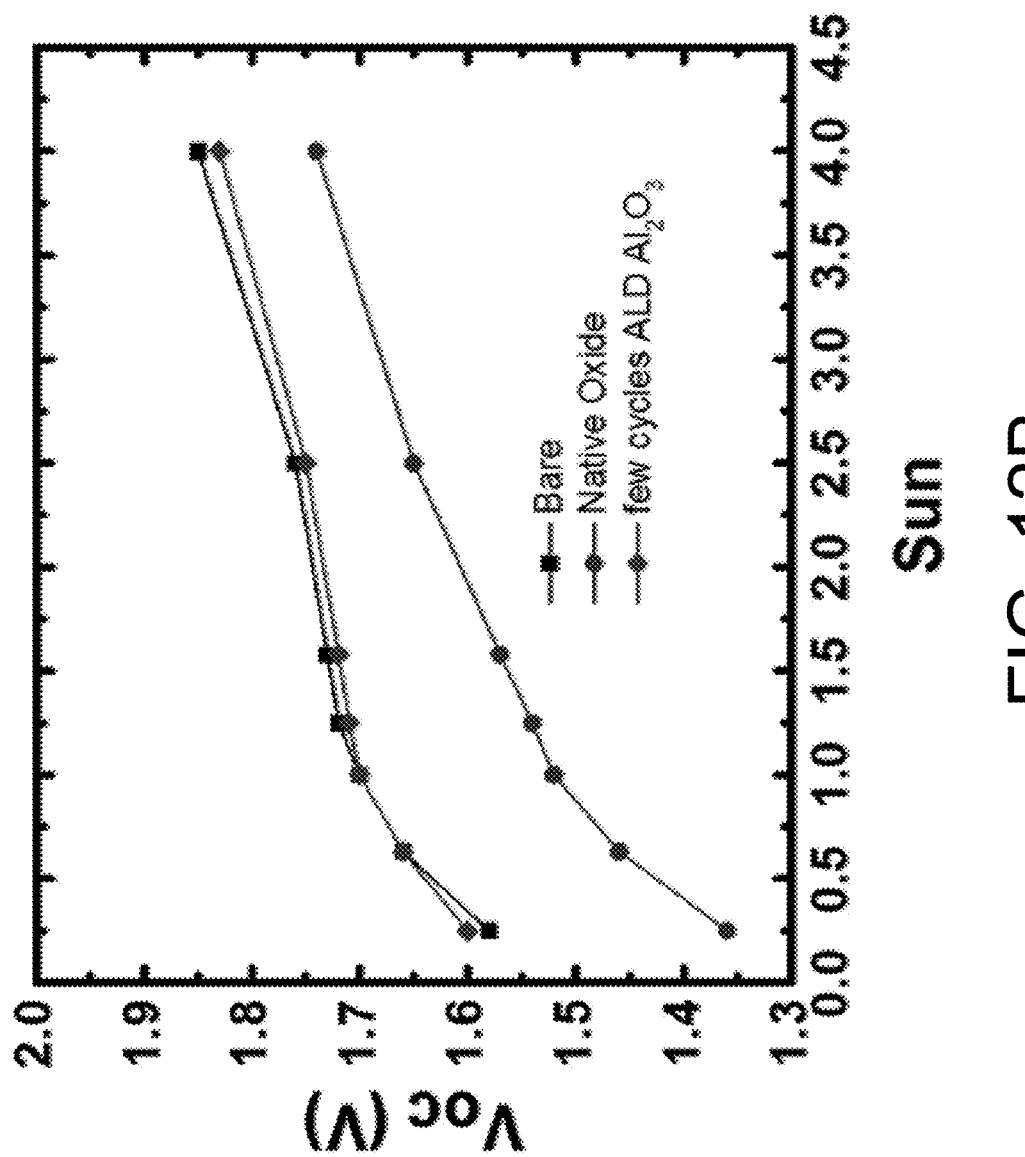
FIG. 12B. The $V_{oc}$ for the AlGaAs/Si tandem solar cell of Example 2.
Figure 12C:
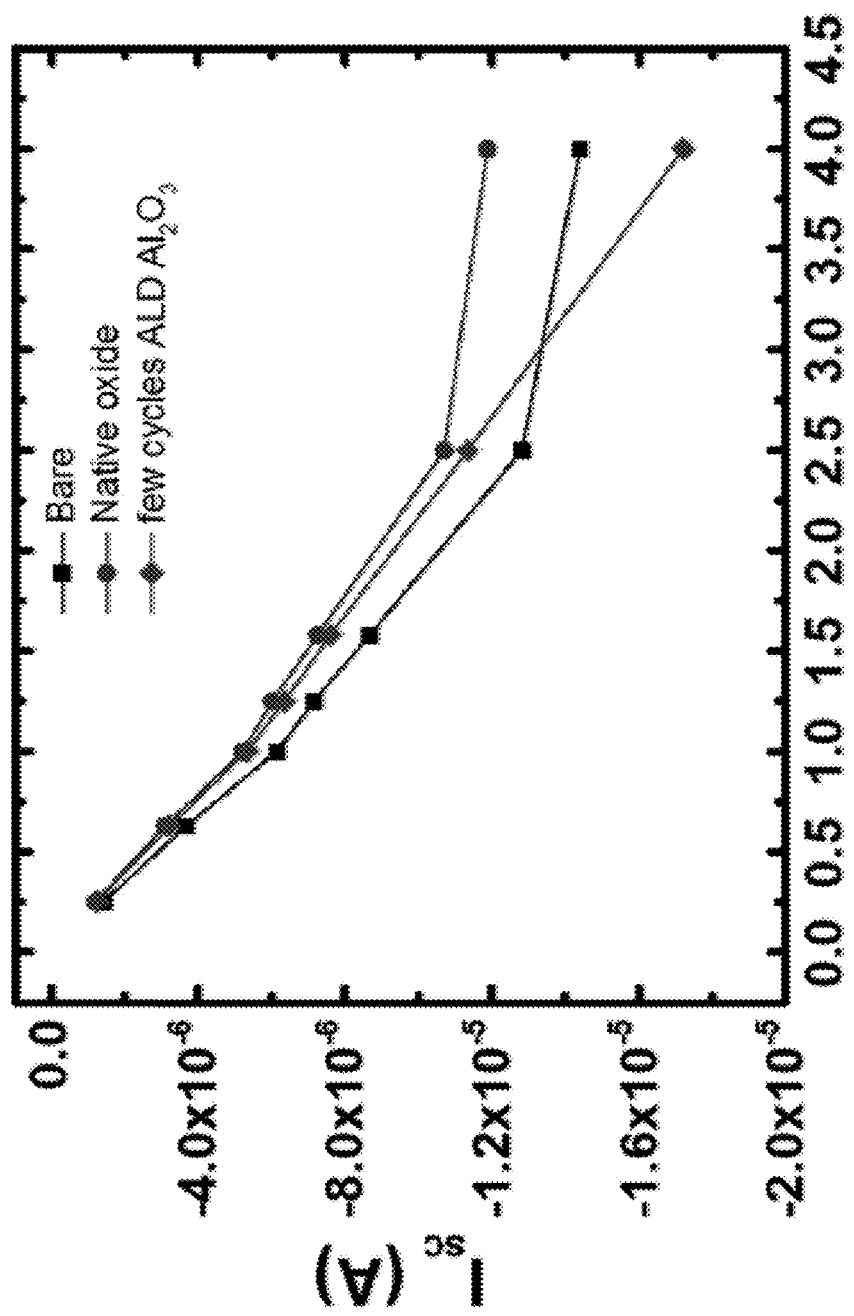
FIG. 12C. The $I_{sc}$ for the AlGaAs/Si tandem solar cell of Example 2.

A systematic comparison of the performance of the tandem solar cell of this example and the two comparative tandem solar cells, under different solar power conditions, are shown in FIGS. 12A, 12B and 12C, which shown the fill factors, the $V_{oc}$ and the $I_{sc}$ for the tandem solar cells, respectively.

The terms "above" and "below", "upper" and "lower", "top" and "bottom", and the like, are not used to designate any absolute orientation. Rather they are merely intended to refer to an arrangement of components if those components happen to be in a vertical orientation. Thus, a stacked structure (e.g., a tandem solar cell) may be disposed on its side, in which case components (e.g., solar cells) referred to as "above" and "below" one another would actually have a side-to-side configuration.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A tandem solar cell comprising:
   (a) a first solar cell comprising: a first back surface field comprising a p- or n-type doped semiconductor; a first base comprising a p- or n-type doped semiconductor; and a first emitter comprising an n- or p-type doped semiconductor, wherein the dopant type of the first back surface field and the first base is the opposite of the dopant type of the first emitter;
   (b) a second solar cell stacked atop the first solar cell, wherein the second solar cell absorbs a different range of wavelengths than the first solar cell, the second solar cell comprising: a second back surface field comprising an p- or n-type doped semiconductor; a second base comprising a p- or n-type doped semiconductor; and a second emitter comprising an n- or p-type doped semiconductor, wherein the dopant type of the second back surface field and the second base is the opposite of the dopant type of the second emitter; and
   (c) a pn diode tunnel junction connecting the first solar cell to the second solar cell, the pn diode tunnel junction comprising: a first tunnel junction layer comprising a first single-crystalline n- or p-type doped semiconductor on the upper surface of the first solar cell; a second tunnel junction layer comprising a second single-crystalline p- or n-type doped semiconductor on the lower surface of the second solar cell, wherein the first single-crystalline n- or p-type doped semiconductor is different than the second single-crystalline p- or n-type doped semiconductor; and a current tunneling layer disposed between and in contact with the first and second tunnel junction layers;
   wherein the current tunneling layer comprises an inorganic material having a bandgap that is wider than the bandgaps of the semiconductors of the first and second tunnel junction layers.

2. The tandem solar cell of claim 1, wherein the inorganic material does not consist of a native oxide of the semiconductors of first or second tunnel junction layers.

3. The tandem solar cell of claim 1, wherein the inorganic material of the current tunneling layer is aluminum oxide.

4. The tandem solar cell of claim 1, wherein the doped semiconductors of the first back surface field of the first solar cell, the first base of the first solar cell, the first emitter of the first solar cell and the first tunnel junction layer comprise a doped Group IV semiconductor; and the doped semiconductors of the second back surface field of the second solar cell, the second base of the second solar cell, the second emitter of the second solar cell and the second tunnel junction layer comprise a doped Group III-V semiconductor.

5. The tandem solar cell of claim 4, wherein the inorganic material does not consist of a native oxide of the semiconductors of first or second tunnel junction layers.

6. The tandem solar cell of claim 5, wherein the inorganic material of the current tunneling layer comprises aluminum oxide.

7. The tandem solar cell of claim 4, wherein the doped Group IV semiconductors of the first back surface field and the first base of the first solar cell is p-type doped; the doped Group IV semiconductors of the first emitter of the first solar cell and the first tunnel junction layer are n-type doped; the doped Group III-V semiconductors of the second tunnel junction, the second back surface field and the second base of the second solar cell are p-type doped; and the Group III-V semiconductor of the second emitter of the second solar cell is n-type doped.

8. The tandem solar cell of claim 7, wherein the inorganic material does not consist of a native oxide of the semiconductors of first or second tunnel junction layers.

9. The tandem solar cell of claim 8, wherein the inorganic material of the current tunneling layer comprises aluminum oxide.

10. The tandem solar cell of claim 7, wherein the Group IV semiconductor of the first base and first emitter of the first solar cell and the first tunnel junction layer is silicon; the Group III-V semiconductor of the second base and second emitter of the second solar cell is an AlGaAs semiconductor; and the Group III-V semiconductor of the second tunnel junction layer is GaAs.

11. The tandem solar cell of claim 10, wherein the inorganic material does not consist of a native oxide of the semiconductors of first or second tunnel junction layers.

12. The tandem solar cell of claim 11, wherein the inorganic material of the current tunneling layer comprises aluminum oxide.

13. The tandem solar cell of claim 10, wherein the AlGaAs of the second base and second emitter of the second solar cell is $Al_{0.3}Ga_{0.7}As$.

14. The tandem solar cell of claim 13, wherein the inorganic material does not consist of a native oxide of the semiconductors of first or second tunnel junction layers.

15. The tandem solar cell of claim 14, wherein the inorganic material of the current tunneling layer comprises aluminum oxide.

16. The tandem solar cell of claim 15, wherein the second solar cell further comprises a window layer comprising n-type doped GaAs disposed over the second emitter and one or more electrically conductive contact pads on the window; and the first solar cell further comprises one or more electrically conductive contact pads on the first back surface field.

* * * * *